(12) United States Patent
Seko et al.

(10) Patent No.: US 8,373,182 B2
(45) Date of Patent: Feb. 12, 2013

(54) SEMICONDUCTOR LIGHT-EMITTING DEVICE AND MANUFACTURING METHOD

(75) Inventors: Toshihiro Seko, Tokyo (JP); Kosaburo Ito, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/229,663

(22) Filed: Sep. 9, 2011

(65) Prior Publication Data

US 2012/0235169 A1  Sep. 20, 2012

(30) Foreign Application Priority Data

Sep. 9, 2010 (JP) ................. 2010-201985

(51) Int. Cl.
  *H01L 33/62* (2010.01)
(52) U.S. Cl. .............. 257/88; 257/98; 257/E33.059; 257/E33.072
(58) Field of Classification Search .............. 257/88, 257/98, E33.059, E33.072
See application file for complete search history.

(56) References Cited

U.S. PATENT DOCUMENTS

| | | | |
|---|---|---|---|
| 7,078,732 B1 | 7/2006 | Reeh et al. | |
| 7,679,100 B2 | 3/2010 | Schwenkschuster et al. | |
| 7,884,466 B2 * | 2/2011 | Ishihara et al. | 257/700 |
| 2006/0022211 A1 | 2/2006 | Yatsuda et al. | |
| 2007/0086148 A1 | 4/2007 | Schwenkschuster et al. | |
| 2008/0054279 A1 | 3/2008 | Hussell et al. | |
| 2009/0001490 A1 | 1/2009 | Bogner et al. | |
| 2009/0134417 A1 | 5/2009 | Sato et al. | |
| 2009/0159912 A1 | 6/2009 | Engl et al. | |
| 2011/0180822 A1 | 7/2011 | Ruhnau et al. | |

FOREIGN PATENT DOCUMENTS

| | | |
|---|---|---|
| EP | 1 189 291 A2 | 3/2002 |
| JP | 11-340515 A | 12/1999 |
| JP | 2004-31989 A | 1/2004 |
| JP | 2004-040099 A | 2/2004 |

(Continued)

OTHER PUBLICATIONS

List of Potentially Related Pending U.S. Patent Applications citing U.S. Appl. No. 13/162,151 to Kosaburo Ito et al. filed Jun. 16, 2011, and U.S. Appl. No. 13/196,868 to Kosaburo Ito et al. filed Aug. 2, 2011.

(Continued)

*Primary Examiner* — Zandra Smith
*Assistant Examiner* — Paul Patton
(74) *Attorney, Agent, or Firm* — Kenealy Vaidya LLP

(57) ABSTRACT

A semiconductor light-emitting device and a method for manufacturing the same can include a wavelength converting layer encapsulating at least one semiconductor light-emitting chip to emit various colored lights including white light. The semiconductor light-emitting device can include a base board with the chip mounted thereon, a frame located on the base board, a transparent plate located on the wavelength converting layer, a reflective material layer disposed between the frame and both side surfaces of the wavelength converting layer and the transparent plate, and a light-absorbing layer located on the reflective material layer. The semiconductor light-emitting device can be configured to improve light-emitting efficiency and a contrast between a light-emitting and non-light-emitting surfaces by using the transparent material and light-absorbing layer. A wavelength-converted light that is emitted can have a high light-emitting efficiency and a high contrast between a light-emitting and non-light-emitting surface from a small light-emitting surface.

20 Claims, 14 Drawing Sheets

FOREIGN PATENT DOCUMENTS

| | | |
|---|---|---|
| JP | 2006-48934 A | 2/2006 |
| JP | 2007-103937 A | 4/2007 |
| JP | 2008-507850 A | 3/2008 |
| JP | 2008-103688 A | 5/2008 |
| JP | 2009-135136 A | 6/2009 |
| JP | 2009-526377 A | 7/2009 |
| JP | 2009-218274 A | 9/2009 |
| JP | 2010-118531 A | 5/2010 |

OTHER PUBLICATIONS

List of Potentially Related Pending Applications citing to U.S. Appl. No. 13/355,754 to Takeshi Waragawa et al. filed Jan. 23, 2012.

List of Potentially Related Pending U.S. Appl. No. 13/325,038 to Takeshi Waragawa et al. filed Dec. 13, 2011.

* cited by examiner

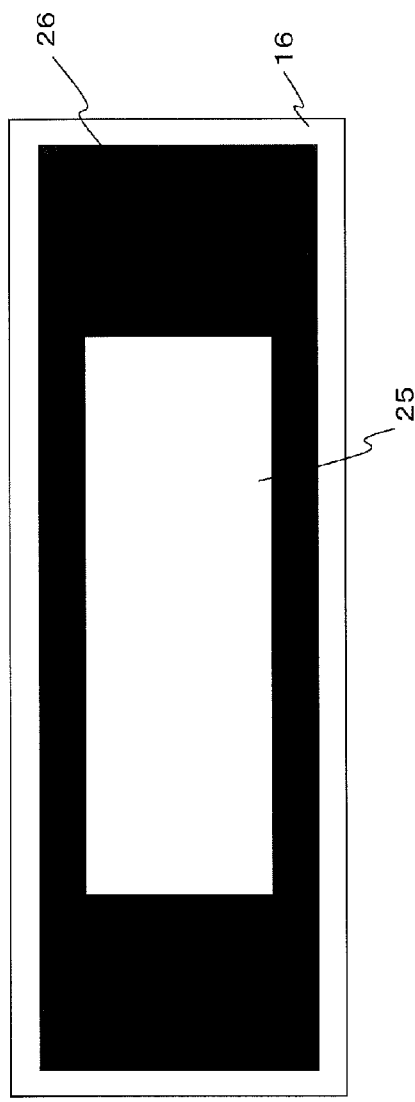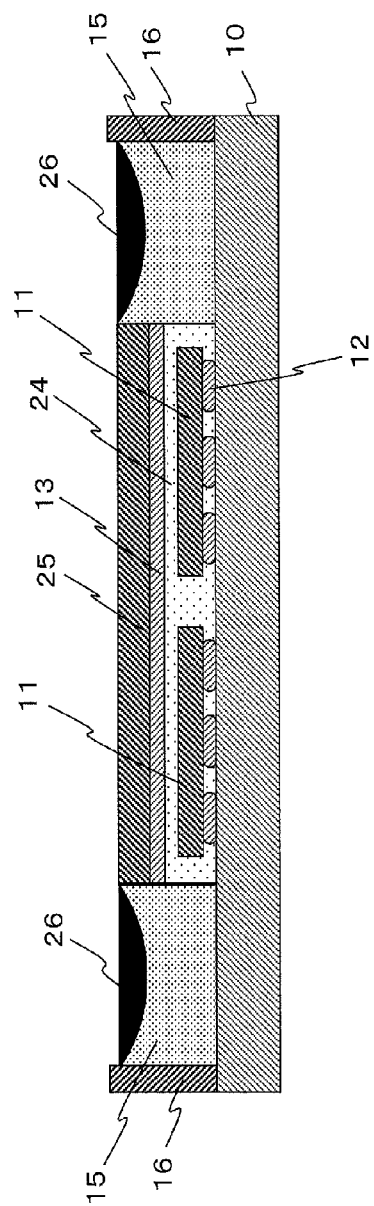
FIG. 1a
FIG. 1b

US 8,373,182 B2

SEMICONDUCTOR LIGHT-EMITTING DEVICE AND MANUFACTURING METHOD

This application claims the priority benefit under 35 U.S.C. §119 of Japanese Patent Application No. 2010-201985 filed on Sep. 9, 2010, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength converting layer, and to manufacturing methods for the same. More particularly, the disclosed subject matter relates to semiconductor light-emitting devices for a vehicle light and the like, which can form a desired light distribution pattern including a light-emitting line such as a horizontal cut-off line with high light-efficiency, and to methods of manufacturing such devices.

2. Description of the Related Art

Semiconductor light sources, in which a part of the light emitted from a semiconductor light-emitting chip is converted into light having a different wavelength by a phosphor and in which a mixture light including the light having the different wavelength mixed with the light emitted directly from the light-emitting chip is emitted, have been used as a light source for various lighting units. In this case, LED light sources that emit light having a desired light distribution pattern by covering a surrounding area of a light-emitting surface thereof with a light-shielding member have been known.

Conventional LED light sources including a light-shielding layer are disclosed in Patent Document No. 1 (U.S. Pat. No. 7,679,100) and Patent Document No. 2 (Japanese Patent Application Laid Open JP2007-103937), which is a Japanese patent application corresponding to Patent Document No. 1. FIGS. 11a and 11b are respectively a schematic top view and a schematic side cross-section view showing a first conventional LED light source, which may be used as a light source for a vehicle headlight and which is disclosed in Patent Documents No. 1 and No. 2.

The first conventional LED light source 30 includes: a casing 32 having a cavity 31 composed of a base board 32a and a frame 32b, and the cavity 31 being formed in the casing 32, which is structured by the base board 32a and the frame 32b; a plurality of LED chips 34 located on the base board 32a in the cavity 31 so as to be spaced at a predetermined interval from a wall 35 of the frame 32b of the casing 32; external electrodes 37 being electrically connected to each of the electrodes of the LED chips 34 via bonding wires 36 for receiving a power supply from an outside battery; and an encapsulating resin 39 disposed in the cavity 31 to encapsulate the LED chips 34.

A wavelength converting material may be mixed in the encapsulating resin 39 so as to be able to wavelength-convert light emitted from the LED chips 34. The wavelength converting material may also be located on the encapsulating resin. In addition, the first LED light source 30 includes a light-shielding layer 33 on a top surface of the frame 32b so that a side surface of the light-shielding layer 33 is aligned with the wall 35 of the casing 32.

Accordingly, the first LED light source 30 may emit white light having a light distribution pattern, which is similar to an enlarged shape of an opening of the cavity 31 that is a light-emitting surface of the LED light source 30 and which includes a light-emitting line having a high contrast that is formed by the light-shielding layer 33. When the first conventional LED light source 30 is used as a light source for a vehicle headlight, the light-emitting line having a high contrast may be used to form a horizontal cutoff line for a low beam.

FIGS. 12a and 12b are a schematic top view and a schematic side cross-section view showing a second conventional LED light source, which may be used as a light source for a vehicle headlight and which is disclosed in Patent Documents No. 3 (Japanese Patent Application Laid Open JP2009-526377). The second conventional LED light source 40 includes: a casing 42 having a cavity 41 composed of a base board 42a and a frame 42b, and the cavity 41 being formed in the casing 42, which is structured by the base board 42a and the frame 42b; a plurality of LED chips 44 located on the base board 42a in the cavity 41 so as to be spaced at a predetermined interval from a wall 45 of the frame 42b of the casing 42; conductor patterns 47 being electrically connected to each of the electrodes of the LED chips 44 via bonding wires 46 so as to receive a power supply from an outside battery; and an encapsulating resin 49 disposed in the cavity 41 to encapsulate the LED chips 44.

In this case, a light-shielding layer 43 is provided on a top surface of the frame 42b so that a side surface of the light-shielding layer 43 is aligned with the wall 45 of the casing 42 to form a light-emitting line having a high contrast using the light-shielding layer 43 in the second LED light source 40, in common with the first LED light source 30. In addition, the second LED light source 40 includes a projecting portion 42c in the frame 42b of the casing 42 toward the wall 45.

Therefore, the second LED light source 40 may emit white light having a light distribution pattern, which is similar to an enlarged shape of an opening of the cavity 41 that is a light-emitting surface of the LED light source 40 and which includes the light-emitting line having a high contrast that is formed by the light-shielding layer 43. In this case, the white light emitted from the cavity 41 may become a relatively uniform light and may include another light-emitting line having a middle contrast opposite to the light-emitting line having a high contrast, in addition to a small light-emitting pattern emitted from a smaller light-emitting surface than that of the first LED light source 30.

On the other hand, Patent Document No. 4 (Japanese Patent Application Laid Open H11-340515) discloses a third conventional light source used for an LED display and the like, which may emit light having a high contrast using a light-absorbing layer and which may maintain a high reliability even when high amounts of static electricity occurs or is present. FIGS. 13a and 13b are a schematic top view and a schematic front cross-section view showing the third conventional LED light source, which is disclosed in Patent Document No. 4.

The third conventional LED light source 50 includes: a casing 52 having a cavity 51, and the cavity 51 including a bottom surface; conductor patterns 57 being formed on the bottom surface of the cavity 51, and extending toward a bottom surface of the casing 52 for receiving a power supply from an outside voltage source; at least one LED chip 54 located on one of the conductor patterns 57, and each of electrodes of the LED chip 54 electrically connected to each of the conductor patterns 57 via bonding wires 56; an encapsulating resin 59 disposed in the cavity 51 to encapsulate the LED chip 54; and a static electricity shield layer 55 located on a top surface of the casing 52, and being connected to a shield grand electrode 58 formed on the bottom surface of the casing 52 via a through hole 58a.

Accordingly, even when high static electricity occurs, because the high static electricity may escape via the shield grand electrode 58 from the static electricity shield layer 55, the third LED light source 50 may be protected from the high static electricity. Moreover, a light-absorbing layer 53 is located on the static electricity shield layer 55 along a boundary between an opening of the cavity 51 and the top surface of the casing 52, and therefore may enhance a contrast between a light-emitting surface of the opening of the cavity 51 and a non-light-emitting surface of the light absorbing layer 53. Hence, the third conventional LED light source 50 may be used as a light source for an LED display apparatus, etc.

In addition, a fourth conventional LED light source, which is used as a light source for an LCD backlight unit and the like, is disclosed in Patent Document No. 5 (European Patent Application EP1189291 A2). FIG. 14 is a schematic perspective view showing the fourth conventional LED light source disclosed in Patent Document No. 5.

The fourth conventional LED light source 60 includes: a base board 62; conductor patterns 67a and 67b formed on surfaces of the base board 62, and extending toward a bottom surface of the base board 62 for receiving a power supply from a voltage source; at least one LED chip 64 located on one of the conductor patterns 67a and 67b, and each of the electrodes of the LED chip 64 is electrically connected to a respective portion of the conductor patterns 67a and 67b via bonding wires 66; an encapsulating resin 69 formed in a rectangular parallelepiped shape to encapsulate the LED chip 64; and a light-shielding layer 63 disposed on side surfaces of the encapsulating resin 69 so as not to disperse light emitted from the LED chip 64 in a crosswise direction.

Consequently, the fourth conventional LED light source 60 may emit white light having a light distribution pattern, which is similar to a top surface of the encapsulating resin 69, from a light-emitting surface of the top surface of the encapsulating resin 69. In this case, the light-shielding layer 63 may improve a contrast between the light-emitting surface of the top surface of the encapsulating resin 69 and a non-light-emitting surface of the side surfaces of the encapsulating resin 69.

When a semiconductor light source is used as a light source for a lighting unit such as a vehicle headlight, which may control light emitted from the light source using a reflector and/or a projector lens, a light source having a small light-emitting surface may be desired to efficiently control light emitted from the light source with a small optical structure. However, in structures including the cavities 31 and 51 such as the first and the third conventional LED light sources 30 and 50, a relatively large cavity is required to locate the at least one LED chip. Therefore, it may be difficult for a structure including a cavity to reduce a light-emitting surface, because the opening of the cavity becomes the light-emitting surface.

In a structure including the raised encapsulating resin 69 from the base board 62 such as the fourth conventional light source 60, because a relatively large amount of encapsulating resin is required to encapsulate the at least one LED chip 64, the structure may also result in difficulty in reducing the light-emitting surface of the top surface of the encapsulating resin 69. In a structure including the projecting portion 42c in the frame 42b such as in the second conventional LED light source 40, the structure may allow relatively easy reduction of the light-emitting surface by extending the projecting portion 42c toward the wall 45 of the casing 42. However, a light-emitting efficiency of the light source 40 may decrease because the projecting portion 42 may interrupt a part of light emitted from the LED chips 44.

Hence, inventors of the presently disclosed subject matter disclosed a conventional semiconductor light-emitting device that can be used as a light source for a vehicle headlight and the like in Patent Document No. 6 (U.S. patent application Ser. No. 13/162,152) and Patent Document No. 7 (U.S. patent application Ser. No. 13/196,868), which can emit light having a high light-emitting efficiency from a small light-emitting surface. In these cases, a reflective material layer can be located around the small light-emitting surface, and therefore a contrast between the light-emitting surface and a non-light-emitting surface of the reflective material layer may not be necessarily high to form a horizontal cut-off line for a vehicle headlight.

On the other hand, each of the first to the fourth conventional LED light sources 30, 40, 50 and 60 may emit light having a high contrast between the light-emitting surface and the non-light-emitting surface using the light-shielding layer. However, a side surface of the light-shielding layer is exposed to the light-emitting surface, and therefore may absorb a part of light emitted from the LED chips. Accordingly, an amount of light emitted from the light-emitting surface may be reduced, and thus the above-described structures may be considered to include a structural problem or characteristic in that the light-emitting surface cannot be reduced.

The above-referenced Patent Documents are listed below, and are hereby incorporated with their English abstracts in their entireties.

1. Patent Document No. 1: U.S. Pat. No. 7,679,100
2. Patent Document No. 2: Japanese Patent Application Laid Open JP2007-103937
3. Patent Document No. 3: Japanese Patent Application Laid Open JP2009-526377
4. Patent Document No. 4: Japanese Patent Application Laid Open H11-340515
5. Patent Document No. 5: European Patent Application EP1189291 A2
6. Patent Document No. 6: U.S. patent application Ser. No. 13/162,151
7. Patent Document No. 7: U.S. patent application Ser. No. 13/196,868

The presently disclosed subject matter has been devised to consider the above and other problems, features, and characteristics in the conventional art devices. Embodiments of the disclosed subject matter can include semiconductor light-emitting devices that can emit a wavelength-converted light having a high light-emitting efficiency and a high contrast between a light-emitting surface and a non-light-emitting surface from a small light-emitting surface, and associated manufacturing methods that do not cause and/or are designed to prevent some of the above-described problems, concerns, and characteristics related to a light-shielding layer. The disclosed subject matter can also include a vehicle headlight using the semiconductor light-emitting device that can form a light distribution pattern including a horizontal cut-off line having a high contrast with a simple structure, which is formed by using a light distribution pattern including a light-emitting line having a high contrast emitted from the light-emitting surface of the device.

SUMMARY

The presently disclosed subject matter has been devised in view of the above and other problems, features, and characteristics in the conventional art, and to make changes to existing semiconductor light-emitting devices. Thus, an aspect of the disclosed subject matter includes methods of manufacture that provide semiconductor light-emitting devices having a small light-emitting surface, a high contrast between the light-emitting surface and a non-light-emitting surface and a high light-emitting efficiency, and which can provide a similar lead time while using a similar manufacture machine in comparison with conventional semiconductor light-emitting devices and processes.

According to an aspect of the disclosed subject matter, a semiconductor light-emitting device can include: a base board having a mounting surface and a conductor pattern formed on the mounting surface; at least one semiconductor light-emitting chip including chip electrodes adjacent a bottom surface, each of the chip electrodes electrically connected to a respective portion of the conductor pattern of the base board via solder bumps; a wavelength converting layer including at least one phosphor, and encapsulating the semiconductor light-emitting chip while surrounding the solder bumps; a transparent plate having an edge portion located between an top surface and an side surface, and disposed on a top surface of the wavelength converting layer, and a side surface thereof aligned with a substantially side surface of the wavelength converting layer; and a frame located adjacent the mounting surface of the base board so as to surround the wavelength converting layer and the transparent plate.

Additionally, the semiconductor light-emitting device can include a reflective material layer having an end of a top surface, disposed between the frame and the side surfaces of the wavelength converting layer and the transparent plate so that the end of the top surface thereof contacts with the side surface of the transparent plate, and the top surface thereof including either one of a concave meniscus shape or a convex meniscus shape, and a light-absorbing layer having an end of a top surface, and disposed on the either one of the concave meniscus shape and the convex meniscus shape of the reflective material layer, wherein the end of the top surface thereof contacts with the side surface of the transparent plate at a higher position than the end of the top surface of the reflective material layer. In this case, a transparent material layer can also located between the transparent plate and the wavelength converting layer so that a side surface thereof is substantially aligned with the side surfaces of the wavelength converting layer and the transparent plate, in order to increase an adhesive strength between the wavelength converting layer and the transparent plate.

In the above-described exemplary semiconductor light-emitting device, the wavelength converting layer can be located over the top surface of the semiconductor light-emitting chip in place of the transparent plate, the transparent material layer can be disposed between a bottom surface of the wavelength converting layer and a side surface of the light-emitting chip so that a side surface thereof extends from the side surface of the light-emitting chip toward the bottom surface of the wavelength converting layer in place of the wavelength converting layer, and the reflective material layer can be disposed between the frame and both the side surface of the wavelength converting layer and the side surface of the transparent material layer and between the bottom surface of the light-emitting chip and the mounting surface of the base board. In this case, the transparent plate can be located in place of the wavelength converting layer, and the wavelength converting layer can also be located in place of the transparent material layer.

In the above-described exemplary semiconductor light-emitting devices, another reflective material layer can be disposed on the top surface of the light-absorbing layer, and can cover the top surface of the light-absorbing layer in order to prevent the light-absorbing layer from absorbing light emitted from the outside. At least a part of the end of the top surface of the light-absorbing layer can also be located at the substantially edge portion on the side surface of the transparent plate or the wavelength converting layer that becomes a light-emitting surface, to enhance a contrast between the light-emitting surface of the device and a non-light-emitting surface of the light-absorbing layer, which is located adjacent the light-emitting surface.

In addition, the reflective material layer can include a particle of titanium oxide, and a density of the particle of titanium oxide included in the reflective material layer can be between 8 weight percent and 30 weight percent in order to form the proper concave meniscus shape on the top surface of the reflective material layer. The light-absorbing layer can include a carbon material, and a light-absorbing ratio of the light-absorbing layer can be 60 percents or more so that a light-emitting line having a high contrast formed between the light-emitting surface and the non-light-emitting surface can be used as a horizontal cut-off line for a vehicle headlight. Moreover, the at least one light-emitting chip can include a blue light-emitting chip, and the at least one phosphor of the wavelength converting layer can be selected from the group consisting of a yellow phosphor, and two phosphors including a red phosphor layer and a green phosphor layer in order to lights having various white tones matched for various lighting units such as a vehicle headlight, etc. Furthermore, a side slant surface of the reflective material layer can be formed in at least one of a substantially linear shape and a convex shape having a curvature of 5 or less extending in a direction toward the light-emitting chip so as to be operated as a reflector for the light-emitting chip.

According to the above-described exemplary semiconductor light-emitting device, the device can emit a wavelength-converted light having a high light-emitting efficiency and a high contrast between the light-emitting surface and the non-emitting surface from a small light-emitting surface that is slightly larger than the top surface of the light-emitting chip, by utilizing features of the reflective material layer and the light-absorbing layer. Thus, the disclosed subject matter can provide semiconductor light-emitting devices that can emit a wavelength-converted light having a high light-emitting efficiency and a high contrast between the light-emitting surface and the non-emitting surface from the small light-emitting surface, which can be used as a light source for various lighting units.

Another aspect of the disclosed subject matter includes vehicle headlights using the above-described semiconductor light-emitting device. An exemplary vehicle headlight can include a projector lens having a focus located on an optical axis toward an incident surface, the focus being located at the substantially top surface of the transparent plate, and the incident surface facing the top surface of the transparent plate. Therefore, the disclosed subject matter can provide vehicle headlights using the semiconductor light-emitting device with a simple structure, which can form a light distribution pattern including a horizontal cut-off line having a high contrast by enlarging a light distribution pattern including a light-emitting line having a high contrast emitted from the light-emitting surface of the device using the projector lens.

Another aspect of the disclosed subject matter includes methods for manufacturing the above-described semiconductor light-emitting devices. An exemplary method for manufacturing the device described above can include: providing the base board; connecting each of the chip electrodes of the at least one semiconductor light-emitting chip to a respective portion of the conductor pattern of the base board via the solder bumps; encapsulating the semiconductor light-emitting chip with an uncured wavelength converting material;

mounting the transparent plate on the uncured wavelength material; disposing an uncured reflective material between the frame and the side surfaces of the wavelength converting layer and the transparent plate; and disposing an uncured light-absorbing layer on either one of the concave meniscus shape or the convex meniscus shape of the reflective material layer.

In the above-described exemplary method for manufacturing semiconductor light-emitting devices, the same or similar variations of the device can also be employed as set forth above.

According to the exemplary manufacturing method described above for the semiconductor light-emitting devices, the light-absorbing layer used for the light-emitting line having a high contrast can be formed by disposing an uncured light-absorbing material on the either one of the concave meniscus shape or the convex meniscus shape of the reflective material layer. The reflective material layer and the light-absorbing layer can be solidified by a similar method as compared to conventional processes. Thus, the method can provide semiconductor light-emitting devices having a small light-emitting surface, a high contrast between the light-emitting surface and a non-light-emitting surface and a high light-emitting efficiency using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein:

FIGS. 1a and 1b are a top view and a front cross-section view showing a first exemplary embodiment of a semiconductor light-emitting device made in accordance with principles of the disclosed subject matter, respectively;

DETAILED DESCRIPTION OF EXEMPLARY EMBODIMENTS

Figure 2A:
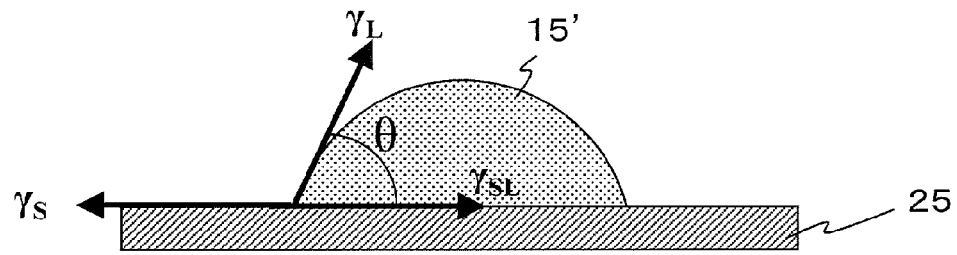
FIGS. 2a to 2c are explanatory drawings depicting relations between a wettability of an uncured reflective material to a transparent plate and a contact angle in the semiconductor light-emitting device of FIG. 1, wherein the wettability of the uncured reflective material increases in order of FIG. 2c, FIG. 2a and FIG. 2b.

Exemplary embodiments and manufacturing methods of the disclosed subject matter will now be described in detail with reference to FIGS. 1 to 10. FIGS. 1a and 1b are a top view and a front cross-section view showing a first exemplary embodiment of a semiconductor light-emitting device made in accordance with principles of the disclosed subject matter, respectively.

The semiconductor light-emitting device can include: a base board 10 having a mounting surface and conductor patterns (not shown in FIG. 1) formed on the mounting surface; at least one semiconductor light-emitting chip 11 having a top surface, a bottom surface, a side surface and chip electrodes adjacent the bottom surface mounted on the mounting surface of the base board 10 via solder bumps 12, and each of the chip electrodes electrically connected to respective conductor patterns of the base board 10 via the solder bumps 12; and a wavelength converting layer 24 having a top surface, a bottom surface and a side surface located between the top surface and the bottom surface.

In addition, the semiconductor light-emitting device can include; a transparent material layer 13 having a top surface, a bottom surface and a side surface disposed on the top surface of the wavelength converting layer 24; a transparent plate 25 having a top surface, a side surface, a bottom surface and an edge portion located between the top surface and the side surface, and located on the top surface of the transparent material layer 13 so that the side surfaces of the transparent plate 25, the transparent material layer 13 and the wavelength converting layer 24 align; a frame 16 located along an outer circumference of the base board 10 so as to surround the semiconductor light-emitting chip 11, the wavelength converting layer 24, the transparent material layer 13 and the transparent plate 25; and a reflective material layer 15 having a top surface and an end of the top surface, and disposed between the frame 16 and the side surfaces of the wavelength converting layer 24, the transparent material layer 13 and the transparent plate 25.

The top surface of the transparent plate 25, which can become a light-emitting surface of the semiconductor light-emitting device, can be formed in various shapes so as to be able to emit light having a desired light distribution pattern in accordance with a variety of usages, specifications and the like for the light-emitting device. The number of the semiconductor light-emitting chip 11 can also be selected according to the shape of the top surface of the transparent plate 25, the usage of the light-emitting device, etc. The top surface of the wavelength converting layer 24 can also be formed in various shapes so as to be matched with the top surface of the transparent plate 25, if desired.

In addition, the wavelength converting layer 24 can be made by mixing a phosphor with a transparent resin, an inorganic binder and the like in order to be able to emit light having a desired color tone while collaborating with the semiconductor light-emitting chip 11 as described in more detail later. The reflective material layer 15 can be made by mixing particle(s) of a light-diffusing material with a resin or an inorganic binder. The reflective material layer 15 can be formed by filling an uncured reflective material between the frame 16 and the side surfaces of the wavelength converting layer 24, the transparent material layer 13 and the transparent plate 25 and by solidifying the uncured reflective material. The top surface of the reflective material layer 15 can be formed in a concave shape.

In other words, the top surface of the reflective material layer 15 can be formed in a convex shape toward the mounting surface of the base board 10. A light-absorbing layer 26 having a top surface, an end of the top surface and a bottom surface can be disposed in the concave shape of the top surface of the reflective material layer 15 and configured as a light-shielding material. The top surface of the light-absorbing layer 26 can be configured to be substantially at a same level as (or co-planar with, or continuous with) the top surface of the transparent plate 25 and so that the bottom surface of the light-absorbing layer 26 become a segment extending toward the mounting surface of the base board 10.

The reflective material layer 15 can contact with the side surfaces of the transparent plate 25, the transparent material layer 13 and the wavelength converting layer 24, and can be located so that the end of the top surface of the reflective material layer 15 is not (or cannot be) higher than the edge portion of the transparent plate 25. A thickness of the reflective material layer 15 can be controlled by adjusting an amount of the uncured reflective material of the reflective material layer 15, which is disposed between the frame 16 and the side surfaces of the wavelength converting layer 24, the transparent material layer 13 and the transparent plate 25.

In this case, the thicker the thickness of the reflective material layer 15 is, the longer a path length of light that enters into the reflective material layer 15 becomes. Accordingly, because an amount of light directed toward the transparent plate 25 increases by increasing the amount of light that is dispersed in (or reflected by) the reflective material layer 15 and because an amount of light that is absorbed by the light-absorbing layer 26 decreases by decreasing a seeping light from the transparent material layer 15 toward the light-absorbing layer 26, tone can thicken the thickness of the reflective material layer 15 to encourage these results.

On the other hand, the bottom surface of the light-absorbing layer 26 can contact with the top surface of the transparent material layer 15, and also can contact with the transparent plate 25 at the edge portion of the transparent plate 25 while contacting with the end of the top surface of the transparent material layer 15. In addition, the top surface of the light-absorbing layer 26 can be substantially the same level as the top surface of the transparent plate 25. That is, the end of the top surface of the light-absorbing layer 26 can contact with the edge portion of the transparent plate 25. Thereby, the semiconductor light-emitting device can emit light having a high contrast between the top surface of the transparent plate 25 that is the light-emitting surface of the device and the light-absorbing layer that is a non-light-emitting surface adjacent the light-emitting surface, and also can allow it to be easy to form a light-emitting line such as a horizontal cut-off line in a light distribution pattern for a vehicle headlight.

The concave shape of the top surface of the reflective material layer 15 can be formed by using an uncured reflective material 15' having a high fluidity and by forming a concave meniscus shape using an interface mechanics phenomenon in state of air, liquid and solid. The light-absorbing layer 26 can be formed by using an uncured light-absorbing material having a high fluidity and by wetting and expanding the uncured light-absorbing material in the concave meniscus shape of the top surface of the reflective material layer 15.

In this case, the uncured reflective material 15' can be disposed between the frame 16 and the side surfaces of the wavelength converting layer 24, the transparent material layer 13 and the transparent plate 25 so as not to wet and expand on the top surface of the transparent plate 25. Hence, the edge portion located between the top surface and the side surface of the transparent plate 25 can be formed in a substantially angular shape (e.g. less than a curvature radius of 0.1 millimeters).

Figure 2B:
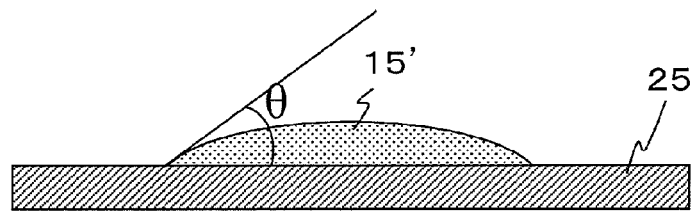
Figure 2C:
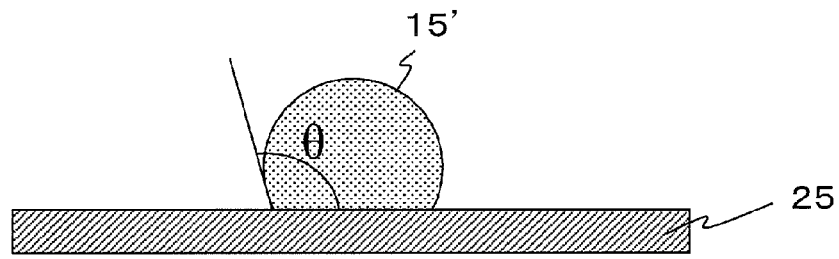

FIGS. 2*a* to 2*c* are explanatory drawings depicting relations between a wettability of an uncured reflective material to a transparent plate and a contact angle in the semiconductor light-emitting device of FIG. 1. The concave shape of the reflective material layer 15 can be controlled by a wettability of the uncured reflective material 15' with respect to the transparent plate 25. The wettability is determined by a balance of surface tensions caused between each of the molecules and atoms, which is represented by an action and the like of a Van der Waals force, a charge, a polar character and a degree of activity in each boundary of a solid to a liquid, a liquid to an air, and an air to a solid.

When the contact angle is defined as $\theta$ and each of the surface tensions caused between the solid and a liquid, between the liquid and the air, and between the air and the solid is defined as $\gamma SL$, $\gamma L$, $\gamma S$, respectively, a relational expression of "$\gamma S = \gamma L \cos \theta + \gamma SL$" is justified. Accordingly, when the wettability of the uncured reflective material 15' with respect to the transparent plate 25 is low, the contact angle $\theta$ becomes large as shown in FIG. 2*c*. When the wettability of the uncured reflective material 15' with respect to the transparent plate 25 becomes high, the contact angle $\theta$ becomes small as shown in FIG. 2*a* and FIG. 2*b*.

Therefore, the concave meniscus shape of the uncured reflective material 15' can be formed by keeping the contact angle $\theta$ at less than 90 degrees, that is, by keeping the wettability of the uncured reflective material 15' with respect to the transparent plate 25 at a high value. In addition, a depth of the concave shape of the uncured reflective material 15' can be varied by adjusting the contact angle $\theta$, so that the depth of the concave shape becomes deeper by decreasing the contact angle $\theta$ as shown in FIG. 3.

The reflective material layer 15 can be made by dispersing particle(s) of a light-diffusing material filler such as titanium oxide, zinc oxide, boron nitride, aluminum nitride, combinations thereof, and the like into a binder such as a silicone resin, an epoxy resin, alky silicate, metal alcoholate, combinations thereof, etc.

The light-absorbing layer 15 can be made by dispersing a light-absorbing material into an organic binder or an inorganic binder, in which a resin such as a silicone resin, an epoxy resin, alky silicate, metal alcoholate and the like is used as the binder. As the light-absorbing material, a metallic fine grain absorbing visible light such as a carbon series material, platinum black, platinum, etc.

Figure 3:
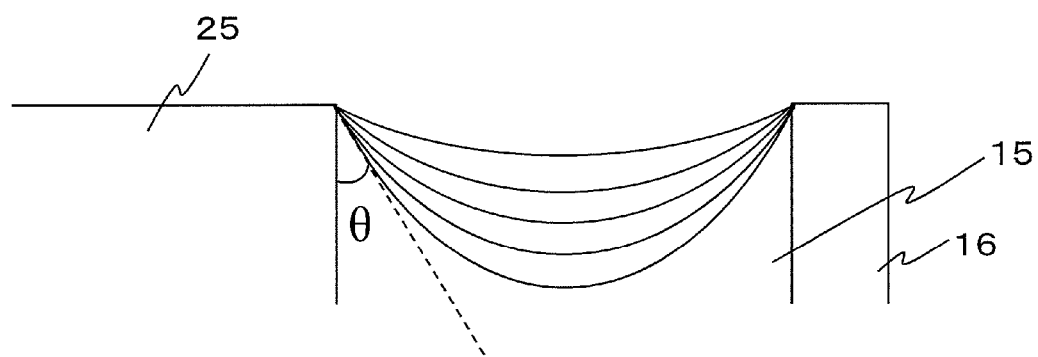
FIG. 3 is an explanatory drawing depicting a relation between the wettability of the uncured reflective material and the contact angle in the semiconductor light-emitting device of FIG. 1.
Figure 4:
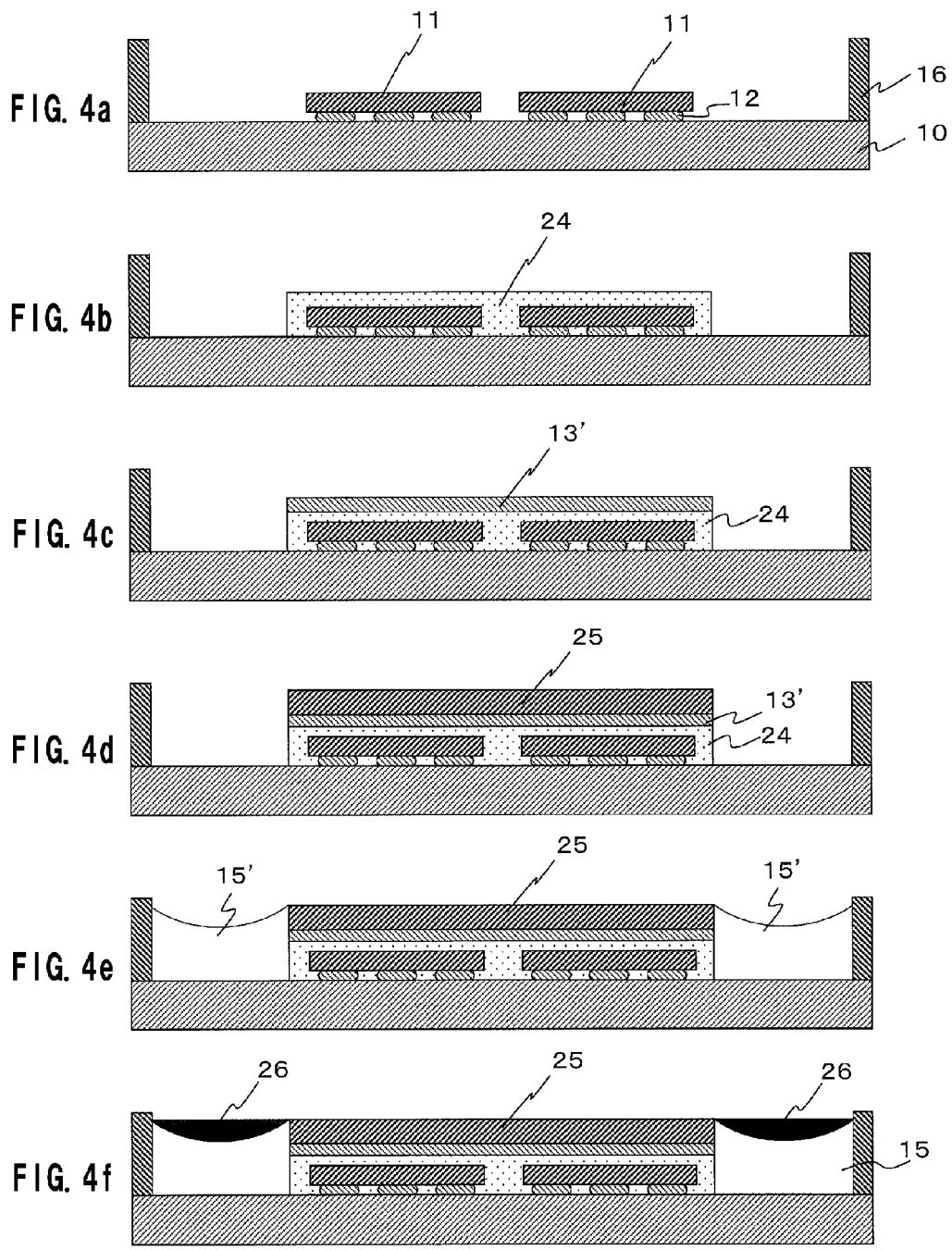
FIGS. 4a to 4f are cross-section views showing an exemplary manufacturing process for the semiconductor light-emitting device made in accordance with principles of the disclosed subject matter.

In FIG. 1b and FIG. 3, a case where both ends of the top surface of the reflective material layer 15 that contact with the frame 16 and the transparent plate 25 are the same level is described. However, a structure in which another end of the top surface of the reflective material layer 15 located toward the frame 16 is lower than the end of the top surface of the reflective material layer 15 located toward the transparent plate 25, that is, a structure in which a depth of the reflective material layer 15 toward the frame 16 is thinner than a depth of the reflective material layer 15 toward the transparent 25 can also be employed.

A structure in which an other end of the top surface of the reflective material layer 15 contacts with the frame 16 is positioned lower than a position where the end of the top surface of the reflective material layer 15 contacts with the side surface of the transparent plate 25 can be accomplish by selecting the material of the frame 16 and the transparent plate 25, so that a wettability of the uncured reflective material 15' with respect to the frame 16 become lower than that of the uncured reflective material 15' with respect to the transparent plate 25. A convex portion can also be provided with an inner surface of the frame 16 to limit the top surface of the reflective material layer 15.

In addition, the contact angle θ of the uncured reflective material 15' with respect to the frame 16 can also be more than 90 degrees. In this case, the top surface of the reflective material layer 15 may be formed in a convex meniscus shape. However, because a top surface of the reflective material layer 15 located between a middle portion of the top surface of the reflective material layer 15 and the transparent plate 25 is formed in a concave shape, the light-absorbing layer 26 can be disposed at least in the half concave shape of the top surface of the reflective material layer 15, which is located toward the transparent plate 25.

The light-absorbing layer 26 can cover the whole top surface of the reflective material layer 15, however, the light-absorbing layer 26 need not necessarily cover the whole top surface of the reflective material layer 15. The light-absorbing layer 26 can be useful to the semiconductor light-emitting device if it can cover a region of the reflective material layer 15 where a leak light emits from the side surface of the transparent plate 25. For example, because an amount of light of 90 percent or more in the leak light is emitted from a region of the reflective material layer 15, which is located within 1 millimeter from the side surface of the transparent plate 25, tone can cover the region of the reflective material layer 15 with the light-absorbing layer 26.

The base board 10 can include an Aluminum nitride substrate having a high thermal conductivity and the like, and the conductor patterns can be made from Au (gold) and the like and formed on the mounting surface of the base board 10 to mount the semiconductor light-emitting chip 11 via the bumps 12 and to receive a power supply for the semiconductor light-emitting chip 11. The bumps 12 can be made of gold (Au), other metals, etc. The transparent material layer 13 can be formed of a transparent resin such as a silicone resin, an epoxy resin, etc. The transparent plate can be formed of an inorganic material such as a glass, etc.

The semiconductor light-emitting chip 11 can be a blue LED chip(s) having a peak wavelength of 460 nanometers. The wavelength converting layer 24 can include a phosphor to convert light emitted from the semiconductor light chip 11 into a particular wavelength or range of wavelengths of light. Thus, the phosphor can be excited by the light emitted from the semiconductor light-emitting chip 11, and can emit a wavelength-converted light. Accordingly, the semiconductor light-emitting device can emit a different wavelength from that of the semiconductor light-emitting chip 11 by an additive color mixture of a part of the light emitted from the semiconductor light-emitting chip 11 and the wavelength-converted light excited by another part of the light.

The wavelength converting layer 24 can include a resin layer that is made by mixing a yellow phosphor such as YAG with a transparent resin such as a silicone resin and the like. In this case, the semiconductor light-emitting chip 11 can be a blue LED chip having a peak wavelength of 460 nanometers. The yellow phosphor can emit a yellow light upon being excited by blue light emitted from the blue LED chip. The semiconductor light-emitting device can emit substantially white light by an additive color mixture of the excited yellow light emitted from the yellow phosphor and a part of the blue light emitted from the blue LED chip.

The yellow phosphor can include, $Y_3Al_5O_{12}$: $Ce^{3+}$ (YAG), $(Sr, Ba)_2SiO_4$: $Eu^{2+}$, $Ca_x(Si, Al)_{12}(O, N)_{16}$: $Eu^{2+}$ and the like. In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light and a part of the blue light.

The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like. $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6(O, N)$: $Eu^{2+}$ and the like can be used as the green phosphor. The semiconductor light-emitting chip 11 can include an LED of InGaN series that emits near-ultraviolet light having a wavelength of approximately 380 nanometers, a laser diode that emits ultraviolet light, and the like.

In this case, in order to emit substantially white light, the at least one phosphor can include: a red phosphor wavelength-converting the ultraviolet light into red light; a green phosphor wavelength-converting the ultraviolet light into green light; and a blue phosphor wavelength-converting the ultraviolet light into blue light. $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like can be used as the red phosphor. $(Si, Al)_6(O, N)$: $Eu^{2+}$, $BaMgAl_{10}O_{17}$: $Eu^{2+}$ $Mn^{2+}$, $(Ba, Sr)_2SiO_4$: $Eu^{2+}$ and the like can be used as the green phosphor. $(Sr, Ca, Ba, Mg)_{10}(PO_4)_6 C_{12}$: $Eu^{2+}$, $BaMgAl_{10}O_{17}$: $Eu^{2+}$, $LaAl(Si, Al)_6(N, O)_{10}$: $Ce^{3+}$ and the like can be used as the blue phosphor.

The transparent material layer 13 and the transparent plate 25 can be a transparent material, which can transmit light emitted from the semiconductor light-emitting chip 11 via the wavelength converting layer 24. A transparent resin such as a silicone resin, an epoxy resin and the like can be used, and a transparent resin that is made by mixing a filler having a particle size of 0.001 to 50 micro meters with the above-described transparent resin and an inorganic material such as a glass and the like can be used as the transparent material layer 13 and the transparent plate 25.

The frame 16 can be formed from the same material as the base board 10, such as with aluminum nitride having a high thermal conductivity, ceramics, and the like. The frame 16 can be attached on the outer circumference of the mounting surface of the base board 10 via an adhesive material so as to surround the reflective material layer 15 including the light-absorbing layer 26 on the top surface thereof, which surrounds the wavelength converting layer 24 encapsulating the semiconductor light-emitting chip 11, the transparent material layer 13 and the transparent plate 25.

The light-absorbing layer 26 can be formed on the top surface of the reflective material layer 15 between the side surface of the transparent plate 25 and the inner surface of the frame 16, and the top surface of the light-absorbing layer 26 can contact with the side surface of the transparent plate 25. Therefore, the semiconductor light-emitting device can be constructed so that the top surface of the transparent plate 25 can become the light-emitting surface, which is slightly larger than the top surface of the semiconductor light-emitting chip 11, and so that the light-emitting surface can contact with a non-light-emitting surface of the light-absorbing layer 26.

According to the semiconductor light-emitting device having the above-described structure, light emitted in an upward direction from the semiconductor light-emitting chip 11 can enter into the wavelength converting layer 24, and a wavelength converted light can be emitted from the top surface of the transparent plate 25 that is the light-emitting surface of the device via the transparent material layer 13. Many of light emitted in a downward direction from the semiconductor light-emitting chip 11 can be reflected by at least one of the bottom surface of the light-emitting chip 11, the phosphor of the wavelength converting layer 24 and the mounting surface of the base board 10, and a wavelength converted light can be emitted from the top surface of the transparent plate 25 via the top surface of the wavelength converting layer 24 as well as the light emitted in the upward direction from the semiconductor light-emitting chip 11.

Light emitted in a crosswise direction from the semiconductor light-emitting chip 11 such as light emitted from the side surface of the light-emitting chip 11 and light directed in a crosswise direction from the transparent material layer 13 and the transparent plate 25 can be reflected toward the top surface of the transparent plate 25 via the reflective material layer 15 while being wavelength-converted by the wavelength converting layer 24, and the wavelength converted light can be emitted from the top surface of the transparent plate 25 to the outside of the device.

In this case, a part of light getting to the side surface of the reflective material layer 15 may enter into the reflective material layer 15 as a leak light, because a reflectivity of the reflective material layer 15 including a diffusing material may not necessarily be 100 percent. If the leak light is emitted from the top surface of the reflective material layer 15 in case that the light-absorbing layer 26 is not located on the reflective material layer 15, a contrast between the light-emitting surface of the top surface of the transparent plate 25 and a non-light-emitting surface of the top surface of the reflective material layer 16 may reduce, and therefore the low contrast may cause a light-emitting line having a low contrast and a low linearity when the light-emitting line is used for a horizontal cut-off line, which is formed by enlarging the light-emitting line using a reflector, an optical lens and the like in a vehicle headlight.

However, the semiconductor light-emitting device of the disclosed subject matter can include the light-absorbing layer 26 located on the top surface of the reflective material layer 15, and thereby a leak light leaked from the top surface of the reflective material layer 15 can be shielded. Thus, because the light-absorbing layer 26 can result in a high contrast between the light-emitting surface and the non-light-emitting surface, the disclosed subject matter can provide the semiconductor light-emitting device that can form a light distribution pattern including a light-emitting line having a high contrast caused between the light-emitting surface and the non-light-emitting surface, and which can form the light distribution pattern in accordance with the substantially shape of the light-emitting surface.

In addition, the light-absorbing layer 26 can be disposed on the concave meniscus of the top surface of the reflective material layer 15, and may not have a substantial thickness at the point where the end of the light-absorbing layer 26 toward the transparent plate 25 contacts with the side surface of the transparent plate 25, although the light-absorbing layer 26 faces the side surface of the transparent plate 25 near the edge portion between the top surface and the side surface of the transparent plate 25.

Accordingly, because the end of the top surface of the light-absorbing layer 26 toward the transparent plate 25 can be located at a lower point than the top surface of the transparent plate 25, a part of light emitted from the light-emitting surface may not be absorbed by the light-absorbing layer 26. Therefore, the disclosed subject matter can provide the semiconductor light-emitting device having a high light-emitting efficiency, in which an intensity of light emitted from the light-emitting surface may not be reduced due to the light-absorbing layer 26 as compared with the light-shielding structures of the conventional LED light sources.

Moreover, in the semiconductor light-emitting device of the disclosed subject matter, because a distance between the side surface of the semiconductor light-emitting chip 11 and the side surface of the reflective material layer 15 toward the transparent plate 25 can be very short, a path length of the light emitted in crosswise direction from the semiconductor light-emitting chip 11 that gets to the top surface of the transparent plate 25 from the semiconductor light-emitting chip 11 may become short. Therefore, the light may rarely be absorbed by the wavelength converting layer 24, the transparent material layer 13 and the transparent plate 25.

Furthermore, the reflective material layer 15 can be located close to the semiconductor light-emitting chip 11 because the reflective material layer 15 can be disposed in a state of the uncured material. Accordingly, the disclosed subject matter can provide the semiconductor light-emitting device having a small light-emitting surface. Although the light-emitting surface of the device is very small, the side surface of the reflective material layer 15 can perform an operation as a reflector for the semiconductor light-emitting chip 11. Thus, because much of the light emitted from the semiconductor light-emitting chip 11 can be directed toward the transparent plate 25 without return to the chip 11, the disclosed subject matter can provide a semiconductor light-emitting device having a higher light-emitting efficiency.

A manufacturing method for the above-described semiconductor light-emitting device will now be described in detail with reference to FIGS. 4a to 4f. FIGS. 4a to 4f are cross-section views showing an exemplary manufacturing process for a semiconductor light-emitting device made in accordance with principles of the disclosed subject matter.

Process (a) is preparing the base board 10 having the conductor patterns formed on the mounting surface and the at least one semiconductor light-emitting chip 11, mounting the semiconductor light-emitting chip 11 on the conductor patterns of the base board 10 via the solder bumps 12, and attaching the frame 16 on the outer circumference of the mounting surface of the base board 10 via the adhesive material so as to surround the semiconductor light-emitting chip 11, as shown in FIG. 4a. In this case, the process for attaching the frame 16 may be carried out until process (e) for disposing the uncured reflective material 15'.

Process (b) is preparing an uncured wavelength converting material mixed with a phosphor with a binder, encapsulating the semiconductor light-emitting chip 11 with the uncured wavelength converting material so as to become a predetermined thickness by a printing method, a potting method, etc. and forming the wavelength converting layer 24 by solidifying the uncured wavelength converting material under a predetermined curing condition, as shown in FIG. 4*b*.

Figure 10:
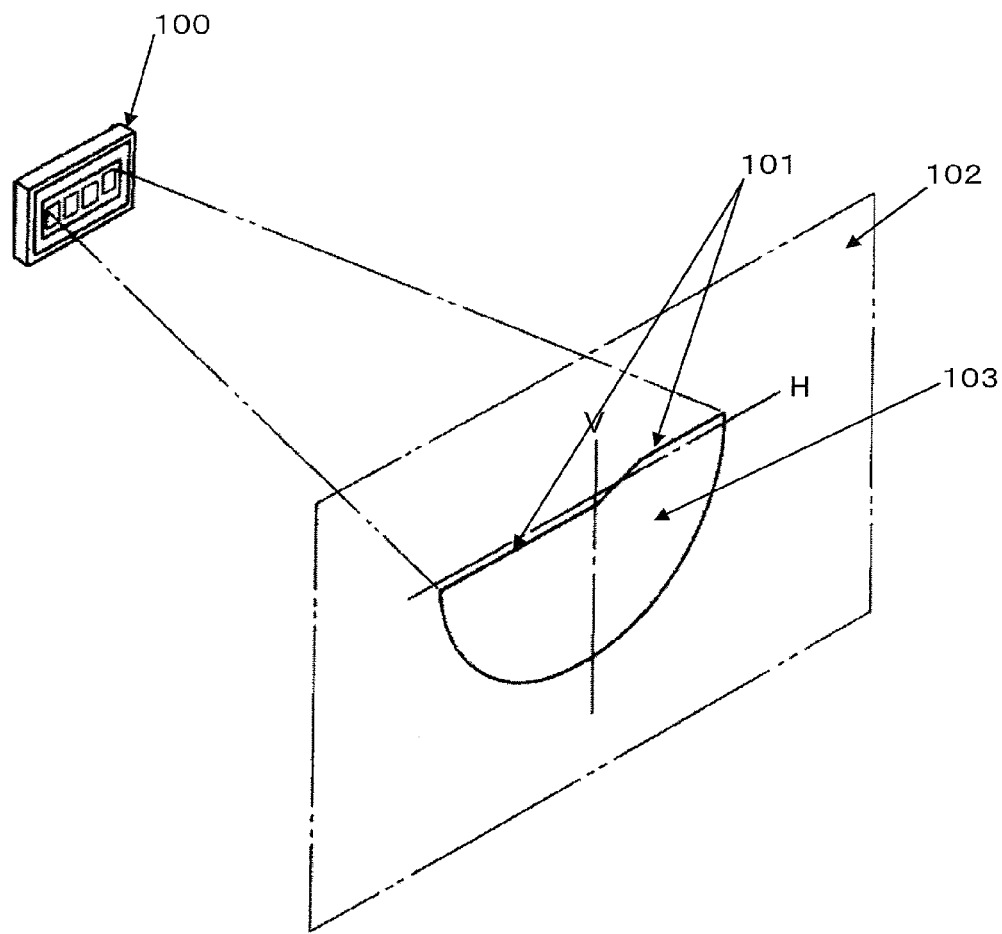
FIG. 10 is a schematic diagram showing a light distribution pattern including a horizontal cut-off line formed by a projector headlight, wherein the projector headlight shows the only semiconductor light-emitting device.
Figure 11A:
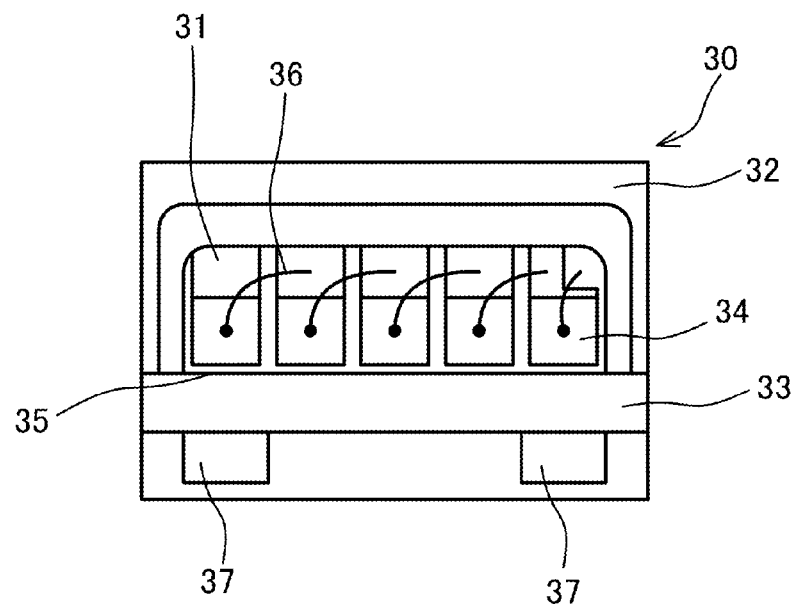
FIGS. 11a and 11b are a schematic top view and a schematic side cross-section view showing a first conventional LED light source, respectively.
Figure 11B:
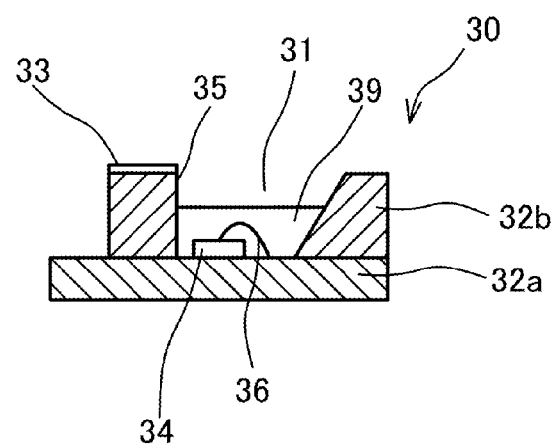
Figure 12A:
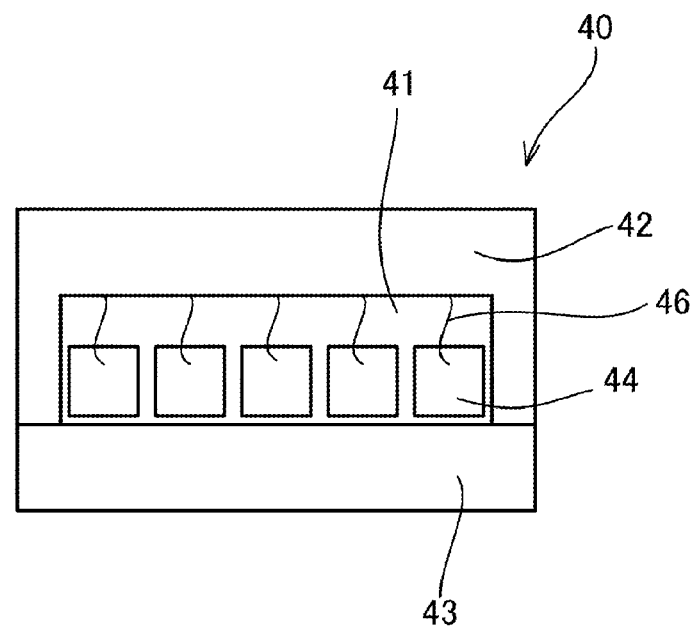
FIGS. 12a and 12b are a schematic top view and a schematic side cross-section view showing a second conventional LED light source, respectively.
Figure 12B:
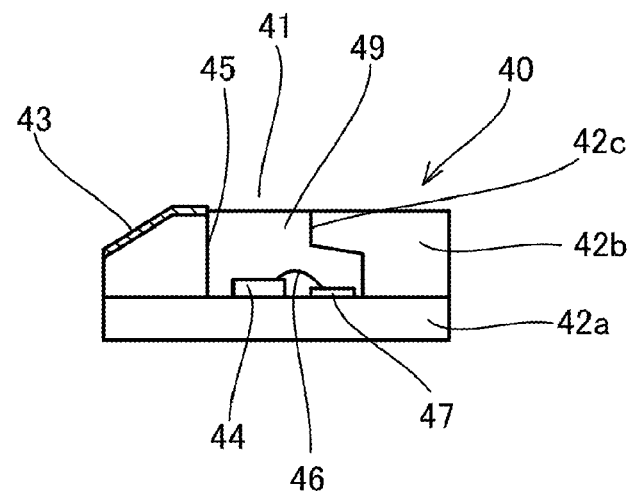
Figure 13A:
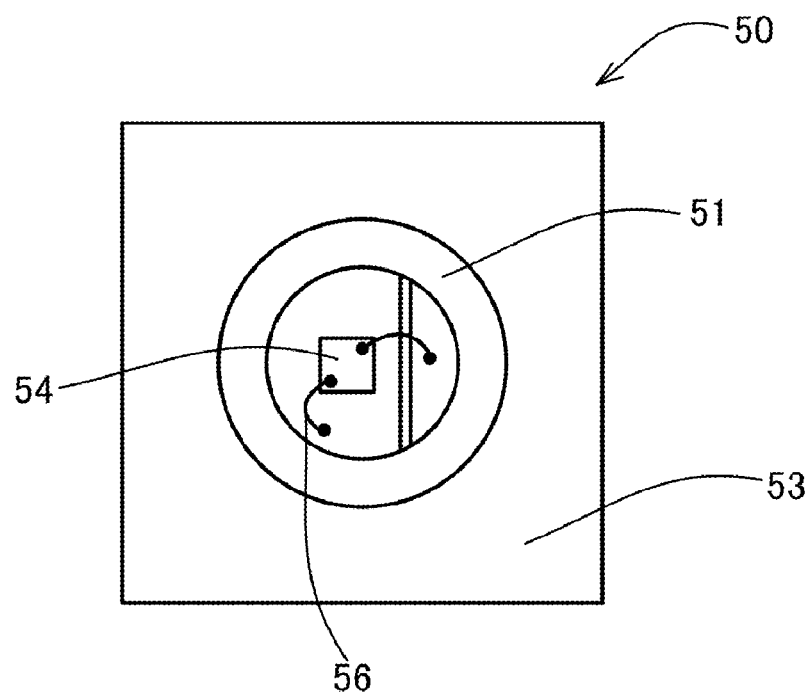
FIGS. 13a and 13b are a schematic top view and a schematic front cross-section view showing a third conventional LED light source, respectively.
Figure 13B:
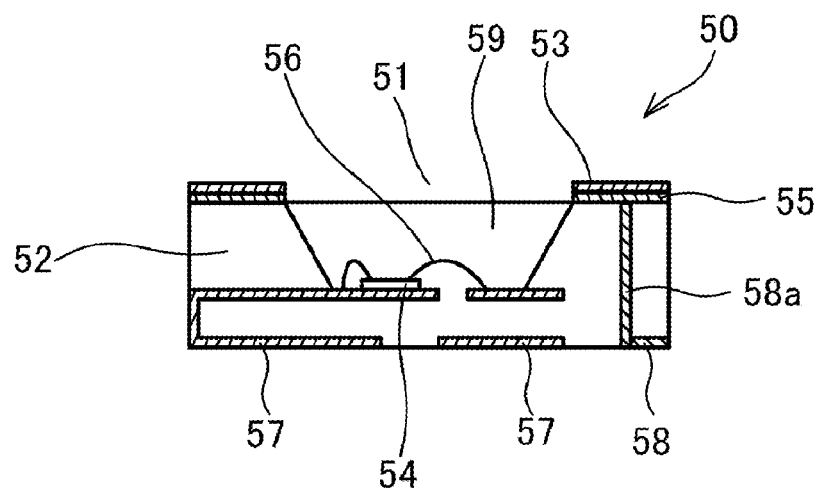
Figure 14:
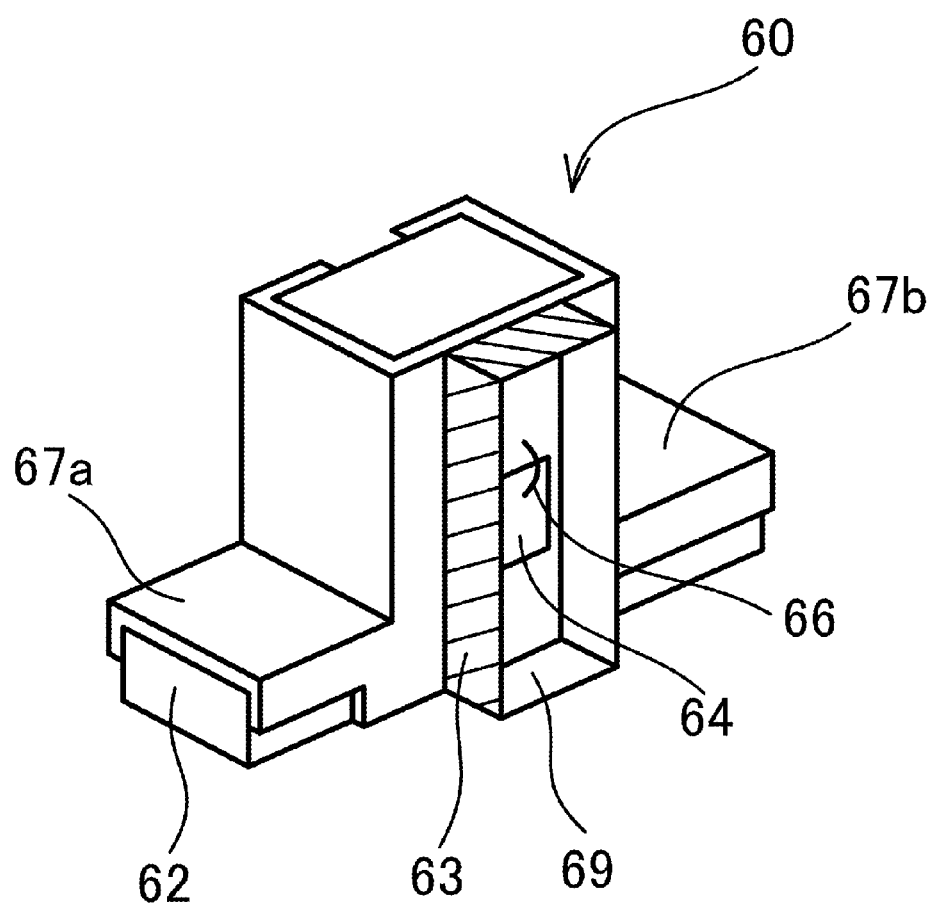
FIG. 14 is a schematic perspective view showing a fourth conventional LED light source.

In the process for encapsulating the semiconductor light-emitting chip 11, a forming tool such as a mask, a mold, a frame and the like may be used for the printing method, the potting method, etc. In this case, the shape of the top surface of the wavelength converting layer 24 can be formed in various shapes such as a square shape, a circular shape and the like by varying a shape of the forming tool, although each shape of the top surfaces of the wavelength converting layer 24 and the transparent plate 25 is described as a rectangular shape in the first embodiments as shown in FIG. 1. For example, when the light-emitting device is used as a light source for a vehicle headlight, each of the top surfaces of the wavelength converting layer 24 and the transparent plate 25 can be formed in a shape, which is similar to a light distribution pattern 103 as shown in FIG. 10, described in detail later.

Process (c) is preparing an uncured transparent material 13' such as a silicon resin, and applying the uncured transparent material 13' on the top surface of the wavelength converting layer 24, as shown in FIG. 4*c*.

Process (d) is preparing the transparent plate 25 such as a glass plate, mounting the transparent plate 25 on the top surface of the uncured transparent material 13', and forming the transparent material layer 13 on the top surface of the wavelength converting layer 24 and attaching the transparent plate 25 on the top surface of the transparent material 13 by solidifying the uncured transparent material 13' under a predetermined condition, as shown in FIG. 4*d*.

In place of the processes (c) and (d), the transparent plate 25 may be mounted on the uncured wavelength converting material in the above-described process (b), and may be attached directly on the wavelength converting layer 24 without the transparent material layer 13 by solidifying the uncured wavelength converting material under the predetermined curing condition. In this case, a lead time of the manufacturing process may be reduced.

Process (e) is preparing the uncured reflective material 15' mixed with a light-diffusing particle with a binder, disposing the uncured reflective material 15' between the frame 16 and the side surfaces of the transparent plate 25, the transparent material layer 13 and the wavelength converting layer 24 so that the end of the top surface of the uncured reflective material 15' contacts with a slightly lower position on the side surface of the transparent plate 25 than the edge portion between the top surface and the side surface of the transparent plate 25 and so that the concave meniscus shape is formed on the top surface of the uncured reflective material 15', and forming the reflective material layer 15 including the concave meniscus shape by solidifying the uncured reflective material 15' under a predetermined condition, as shown in FIG. 4*e*. In this case, the uncured reflective material 15' can be selected in view of the contact angle thereof with respect to the transparent plate 25, as described above.

Process (f) is preparing the uncured light-absorbing material mixed with a light-absorbing material with a binder, disposing the uncured reflective material 15' in the concave meniscus shape of the reflective layer 15, and forming the light-absorbing layer 26 on the top surface of the reflective material layer 15 so that the end of the top surface of the light-absorbing layer 26 contacts with the edge portion on the side surface of the transparent plate 25, by solidifying the uncured light-absorbing material under a predetermined condition, and finishing the semiconductor light-emitting device. The above process steps can be done consecutively and sequentially, or can be interchanged in timing and non-sequential.

In the manufacturing method described above, the uncured reflective material 15' and the uncured light-absorbing material are solidified in the individual process. However, by adjusting each viscosity of the uncured reflective material 15' and the uncured light-absorbing material so as not to mix with respect to each other, the uncured reflective material 15' and the uncured light-absorbing material can also be solidified at once after disposing the uncured light-absorbing material in the concave meniscus shape of the uncured reflective material 15'.

Additionally, in the process (f), the whole end of the top surface of the light-absorbing layer 26 need not necessarily contact with the edge portion on the side surface of the transparent plate 25. A part of the end of the top surface of the light-absorbing layer 26 where the light-emitting line having a high contrast is formed can contact with the edge portion of the transparent plate 25. For example, when the light-emitting device is employed as a light source for a vehicle headlight, an only part of the end of the top surface of the light-absorbing layer 26 corresponding to a horizontal cut-off line 101 in the light distribution pattern 103 shown in FIG. 10 can contact with the edge portion on the side surface of the transparent plate 25, and another part of the end of the top surface of the light-absorbing layer 26 can contact with the side surface of the transparent plate 25.

Thereby, the horizontal cut-off line 101 can be formed by the light-emitting line having a high contrast of the device, and another boundary line in the light distribution pattern 103 can be formed by another light-emitting line having a middle contrast of the device. In this case, the light-emitting lines having a different contrast can be formed by varying at least one of thickness distributions of the transparent material layer 15 and the light-absorbing layer 26 and by varying a contact location of the end of the top surface of the light-absorbing layer 26 and the side surface of the transparent plate 25. Moreover, the light-emitting lines having a different contrast can also be accomplished by changing a thickness distribution of the transparent plate 25, that is, by reducing a thickness of a part of the transparent plate 25 corresponding to the light-emitting line having a high contrast and by thickening a thickness of another part of the transparent plate 25 corresponding to the light-emitting line having a middle contrast.

Here, each condition of densities and thicknesses of the reflective material layer 15 and the light-absorbing layer 26 will now be described. It is possible to increase a density of the light-diffusing particle in the reflective material layer 15 because the higher the density of the light-diffusing particle in the reflective material layer 15 is, the higher a reflectivity of the reflective material layer 15 is. However, when the density of the light-diffusing particle is over-high, it may become difficult to form the meniscus shape due to a low fluidity. Consequently, the reflective material layer 15 can be set up at a density of 30 weight percent or less, which is the highest density to form the meniscus shape on the top surface of the reflective material layer 15.

With respect to the density of the light-diffusing particle in the reflective material layer 15 and the thickness of the reflective material layer 15, the density and the thickness of the reflective material layer 15 can be set up so that a light-intensity ratio of the leak light leaked from the top surface of the reflective material layer 15 to an intensity of light emitted from the light-emitting surface (the top surface of the transparent plate 25) can become 3 percent or less when the light-absorbing layer 26 is not provided on the reflective material layer 15. Thereby, a light loss for absorbing the leak light with the light-absorbing layer 26 can be inhibited within 10 percent. In addition, the density of the light-diffusing particle and the thickness of the reflective material layer 15 can also be set up so that the above-described light intensity ratio becomes 1 percent or less.

When the semiconductor light-emitting device is employed as a light source for a vehicle headlight and the like, especially when the device is used to form a light distribution pattern including a horizontal cut-off line for a low beam, a light-intensity ratio of the leak light leaked from the top surface of the light-absorbing layer 26 to the intensity of light emitted from the light-emitting surface can be maintained within 0.4 percent in case that the light-absorbing layer 26 is provided on the reflective material layer 15.

In order to realize the above-described light intensity ratio, when the light-intensity ratio of the leak light leaked from the top surface of the reflective material layer 15 to the intensity of light emitted from the light-emitting surface is 1 percent or less in case that the light-absorbing layer 26 is not provided on the reflective material layer 15, a light-absorbing ratio of the light-absorbing layer 26 can become 60 percent or more. When the light-intensity ratio of the leak light is 3 percent or less, the light-absorbing ration of the light-absorbing layer 26 can become 87 percent or more. In this case, the light-absorbing ratio of the light-absorbing layer 26 can be controlled by adjusting a density of the light-absorbing material in the light-absorbing layer 26 and a thickness of the light-absorbing layer 26.

With respect to the density of the light-diffusing particle in the reflective material layer 15, when the light-diffusing particle is titanium oxide, the density of the light-diffusing particle in the reflective material layer 15 can be set up at 8 weight percent or more in view of a light blocking effect of the reflective material layer 15. However, a viscosity of the reflective material layer 15 increases as the density thereof increases, although the higher that a density of the reflective material layer 15 is, the higher the light blocking effect is. Accordingly, the density of the light-diffusing particle of titanium oxide can be set up at 30 weight percent or less in view of the viscosity of the reflective material layer 15. When the density of the light-diffusing particle of titanium oxide is 20 weight percent, the contact angle of the uncured reflective material 15' with respect to the transparent plate 25 (or the wavelength converting layer 24) may be approximately 60 degrees.

Figure 5:
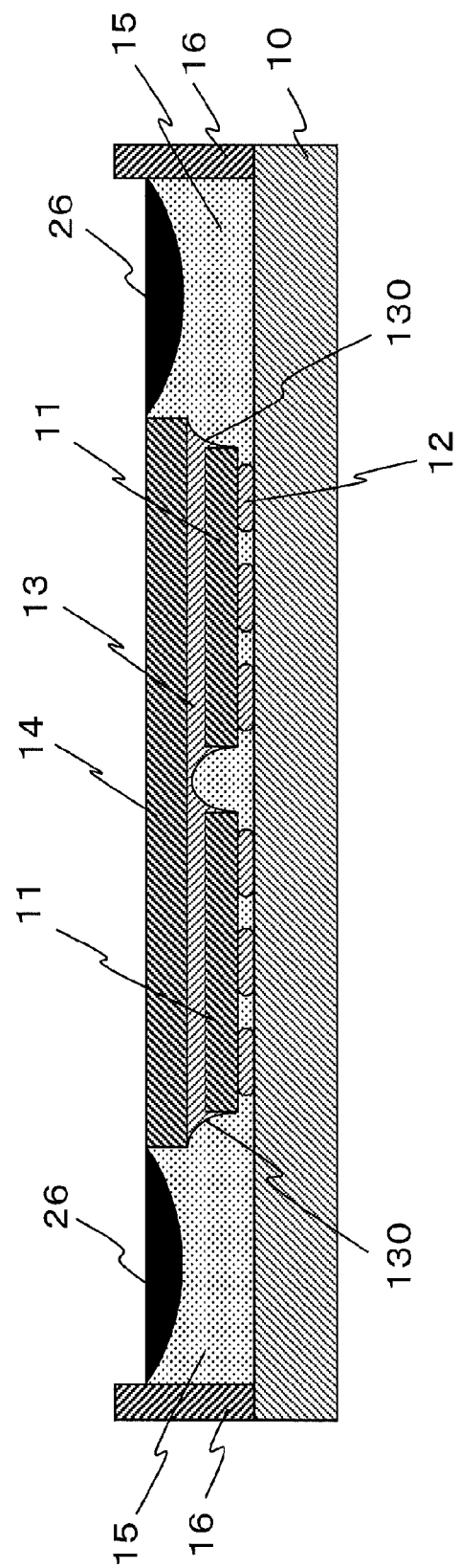
FIG. 5 is a front cross-section view showing a second exemplary embodiment of a semiconductor light-emitting device made in accordance with principles of the disclosed subject matter.

Second exemplary embodiments of the disclosed subject matter will now be described with reference to FIG. 5. FIG. 5 is a front cross-section view showing the second exemplary embodiments of a semiconductor light-emitting device made in accordance with principles of the disclosed subject matter.

The semiconductor light-emitting device can include: the base board 10 having the mounting surface and the conductor patterns (not shown in FIG. 5) formed on the mounting surface, as with the first embodiment; at least one semiconductor light-emitting chip 11 having the top surface, the bottom surface, the side surface and the chip electrodes adjacent the bottom surface mounted on the mounting surface of the base board 10 via the solder bumps 12, and each of the chip electrodes electrically connected to the respective conductor patterns of the base board 10 via the solder bumps 12, as with the first embodiment; and a wavelength converting layer 14 having a top surface, a bottom surface and a side surface located over the top surface of the semiconductor light-emitting chip 11, and the top surface and bottom surface thereof being slightly larger than the top surface of the semiconductor light-emitting chip 11.

In addition, the semiconductor light-emitting device can include; the transparent material layer 13 disposed between the side surface of the semiconductor light-emitting chip 11 and the bottom surface of the wavelength converting layer 14 so as to extend from the side surface of the semiconductor light-emitting chip 11 toward the bottom surface of the wavelength converting layer 14, unlike the first embodiment; the frame 16 located along an outer circumference of the base board 10; the reflective material layer 15 disposed between the frame 16 and the side surfaces of the wavelength converting layer 14 and the transparent material layer 13 while forming the concave meniscus shape on the top surface thereof, and disposed between the bottom surface of the semiconductor light-emitting chip 11 and the mounting surface of the base board 10 so as to fill a space between the solder bumps 12; and the light-absorbing layer 26 disposed in the concave shape of the reflective material layer 15, in common with the first embodiment.

By disposing the reflective material layer 15 between the bottom surface of the semiconductor light-emitting chip 11 and the mounting surface of the base board 10 so as to fill the space between the solder bumps 12, light emitted in a downward direction of the semiconductor light-emitting chip 11 from the light-emitting chip 11 can be efficiently reflected on the reflective material layer 15 and can be emitted from the top surface of the semiconductor light-emitting chip 11. Accordingly, light use efficiency of the semiconductor light-emitting device can improve.

The bottom surface of the wavelength converting/material layer 14 can be slightly larger than the top surface of the semiconductor light-emitting chip 11, and the wavelength material layer 14 can be located over the semiconductor light-emitting chip 11 so that the bottom surface of the wavelength material layer 14 can cover the top surface of the semiconductor light-emitting chip 11. In other words, an outermost periphery of the semiconductor light-emitting chip 11 will be completely blocked from view by the wavelength material layer 14 when the device is viewed from a position on the main optical axis which extends normal to the top center surface of the chip 11. Therefore, a side slant surface 130 formed on a boundary between the reflective material layer 15 and the transparent material layer 13 can become a reflective surface, which can reflect light emitted in a crosswise direction from the light-emitting chip 11 toward the bottom surface of the wavelength material layer 14.

That is to say, the reflective material layer 15 can perform as a reflector for the semiconductor light-emitting chip 11 by using the side slant surface 130 and the boundary surface contacting with the bottom surface of the semiconductor light-emitting chip 11. Thus, the semiconductor light-emitting device can improve light-emitting efficiency as compared with the conventional device and the device of the first embodiment.

In addition, because the reflective material layer 15 contacts with the side surface of the wavelength converting layer 14, the top surface of the wavelength converting layer 14 can perform as a light-emitting surface of the semiconductor light-emitting device. Thus, the disclosed subject matter can realize a very small light-emitting surface that is slightly larger than the top surface of the semiconductor light-emitting chip 11, by using the top surface of the wavelength converting layer 14.

The side slant surface 130 of a boundary between the reflective material layer 15 and the transparent material layer 13 can be formed in a concave shape extending in an inward direction towards a center of the device, as shown in FIG. 5. However, the side slant surface 130 cannot be limited to the above shape, and the side slant surface 130 can be formed in a linear shape connecting an end of the bottom surface of the wavelength converting layer 14 to an end of the bottom surface of the semiconductor light-emitting chip 11, and also can be formed in a concave shape extending in an outward direction away from a center of the semiconductor light-emitting device.

An end of the side slant surface 130 toward the semiconductor light-emitting chip 11 does not always need be located at the end of the bottom surface of the semiconductor light-emitting chip 11. The end of the side slant surface 130 can be located on the side surface of the semiconductor light-emitting chip 11, which is between both ends of the top and bottom surface of the semiconductor light-emitting chip 11.

When the end of the side slant surface 130 is located on the side surface of the semiconductor light-emitting chip 11, the side slant surface 130 can become the reflex (e.g., a reflector type) surface, which can reflect light emitted in the crosswise direction of the semiconductor light-emitting chip 11 toward the bottom surface of the wavelength converting layer 14. When the semiconductor light-emitting chip 11 is a flip-chip type chip, because a light-emitting layer of the semiconductor light-emitting chip 11 may be located close to the bottom surface of the semiconductor light-emitting chip 11, a reflex feature of the side slant surface 130 can be performed with high efficiency.

The wavelength converting layer 14 can include a resin layer that is made by mixing a yellow phosphor with a transparent resin such as a silicone resin and the like, as described in regard to the wavelength converting layer 24 of the first embodiment. In addition, the wavelength converting layer 14 can also include a glass plate including the yellow phosphor, and/or a phosphor ceramic plate such as YAG plate that is made by sintering the yellow phosphor such as YAG.

According to the second embodiment having the above-described structure of the disclosed subject matter, light emitted in an upward direction from the semiconductor light-emitting chip 11 can enter into the wavelength converting layer 14 via the transparent material layer 13, and a wavelength converted light can be emitted from the top surface of the wavelength converting layer 14. Light emitted in a downward direction from the semiconductor light-emitting chip 11 can be reflected at the bottom surface of the light-emitting chip 11 by the reflective material layer 15, and a wavelength converted light can be emitted from the top surface of the wavelength converting layer 14 along with the light emitted in the upward direction from the semiconductor light-emitting chip 11.

Light emitted in a crosswise direction from the semiconductor light-emitting chip 11 such as light emitted from the side surface of the light-emitting chip 11 can be reflected toward the wavelength converting layer 14 via the transparent material layer 13, by the side slant surface 130 that is formed at the boundary between the reflective material layer 15 and the transparent material layer 13.

Thereby, much of the light emitted in the crosswise direction of the light-emitting chip 11 can be prevented from being absorbed by the light-emitting chip 11 because the above described light may not return into the light-emitting chip 11. In addition, because a distance between the side surface of the light-emitting chip 11 and the reflective material layer 15 is very short, many of the light emitted in the crosswise direction of the light-emitting chip 11 can be prevented from being absorbed by the transparent material layer 13.

As described above, the light emitted from the semiconductor light-emitting chip 11 can enter into the wavelength converting layer 14 via the transparent material layer 13, directly or reflected by the reflective material layer 15. Therefore, the semiconductor light-emitting device can emit a different wavelength light from that of the semiconductor light-emitting chip 11 by use of an additive color mixture of part of the light emitted from the semiconductor light-emitting chip 11 and the wavelength-converted light excited by another part of the light via the wavelength converting layer 14. Light emitted in a crosswise direction from the wavelength converting layer 14 can be reflected into the wavelength converting layer 14 at the side surface of the wavelength converting layer 14 by the reflective material layer 15, and can be emitted from the top surface of the wavelength converting layer 14.

Therefore, the second embodiment of the disclosed subject matter can provide a small semiconductor light-emitting device having a small light-emitting surface, which is the top surface of the wavelength converting layer 14. The semiconductor light-emitting device can also form a light distribution pattern having a high contrast between the light-emitting surface and the non-light-emitting surface using the wavelength converting layer 14 and the light-absorbing layer 26.

In addition, because the reflective material layer 15 can be formed in a reflector shape that extends from the semiconductor light-emitting chip 11 in a light-emitting direction of the light-emitting device, the light emitted in the crosswise direction of the light-emitting chip 11 can be prevented from returning to the light-emitting chip 11 and can be reflected toward the wavelength converting layer 14 by the side slant surface 130. Moreover, the light emitted in downward direction of the light-emitting chip 11 can be reflected toward the wavelength converting layer 14 at the bottom surface of the light-emitting chip 11 by the reflective material layer 15, which is disposed between the bottom surface of the light-emitting chip 11 and the mounting surface of the base board 10 so as to surround the bumps 12. Thus, the second embodiment of the disclosed subject matter can also provide a small semiconductor light-emitting device having a high light-emitting efficiency.

A manufacturing method for the above-described semiconductor light-emitting device will now be described in detail with reference to FIGS. 6a to 6e. FIGS. 6a to 6e are front cross-section views showing an exemplary manufacturing process for the second embodiment of the semiconductor light-emitting device made in accordance with principles of the disclosed subject matter.

Figure 6A:
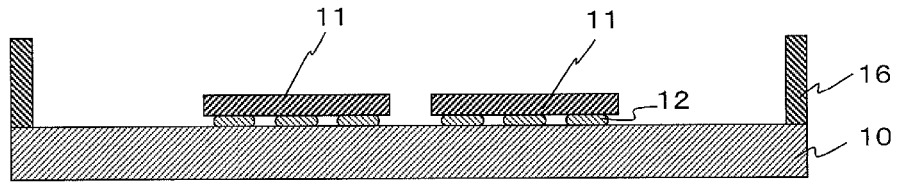
FIGS. 6a to 6e are front cross-section views showing an exemplary manufacturing process for the second embodiment of the semiconductor light-emitting device made in accordance with principles of the disclosed subject matter.

Process (a) is preparing the base board 10 having the conductor patterns formed on the mounting surface and the at least one semiconductor light-emitting chip 11, mounting the semiconductor light-emitting chip 11 on the conductor patterns of the base board 10 via the solder bumps 12, and attaching the frame 16 on the outer circumference of the mounting surface of the base board 10 via the adhesive material so as to surround the semiconductor light-emitting chip 11, as shown in FIG. 6a. In this case, the process for attaching the frame 16 may be carried out until process (e) for disposing the uncured reflective material 15'.

Figure 6B:
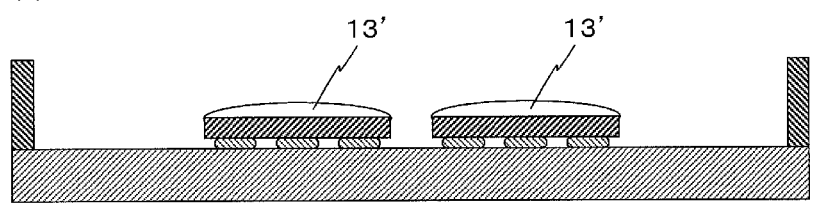

Process (b) is preparing an uncured transparent material 13' such as a silicon resin, and applying the uncured transparent material 13' on the top surface of the semiconductor light-emitting chip 11, as shown in FIG. 6b.

Figure 6C:
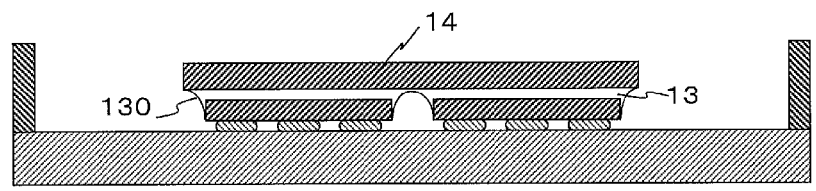

Process (c) is mounting the wavelength converting layer 14 that is formed in a plate shape and is formed in a slightly larger size than the top surface of the semiconductor light-emitting chip 11 on the uncured transparent material 13', and thereby forming the reflector shape of the uncured transparent material 13' that extends to the bottom surface of the wavelength converting layer 14 from the side surface of the semiconductor light-emitting chip 11 by maintaining a surface tension while the uncured transparent material 13' covers at least the side surface of the semiconductor light-emitting chip 11, and forming the transparent material layer 13 and attaching the wavelength converting layer 13 on the top surface of the transparent material layer 13 by solidifying the uncured transparent material 13' under a prescribed curing condition, as shown in FIG. 6c.

In this case, a shape of the reflector of the uncured transparent material 13' may vary in accordance with an amount of the uncured transparent material 13'. When the amount of the uncured transparent material 13' is small, the side slant surface 130 of the reflector shape can be formed in a concave shape in the inner direction of the light-emitting device. When the amount of the uncured transparent material 13' increases, the side slant surface 130 of the reflective shape can be formed in a substantially linear surface, and when the amount of the uncured transparent material 13' further increases, the side slant surface of the reflective shape can be formed in a concave surface extending in the outward direction of the light-emitting device. In addition, the uncured transparent material 13' may be semi-solidified under a semi-curing condition if the reflector shape does not vary in following processes.

Figure 6D:
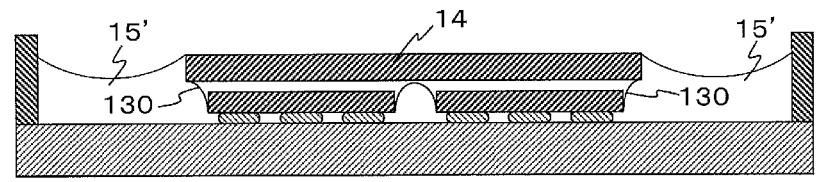
Figure 6E:
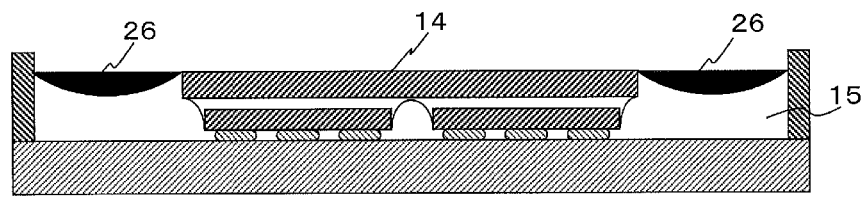

Process (d) is preparing the uncured reflective material 15' mixed with a light-diffusing particle with a binder, disposing the uncured reflective material 15' between the frame 16 and the side surfaces of the wavelength converting layer 14 and the transparent material layer 13 and between the bottom surface of the wavelength converting layer 24 and the mounting surface of the base board 10 so as to surround the solder bumps 12 while the end of the top surface of the uncured reflective material 15' contacts with a slightly lower position on the side surface of the wavelength converting layer 14 than the edge between the top surface and the side surface of the wavelength converting layer 14 so that the concave meniscus shape is formed on the top surface of the uncured reflective material 15', and forming the reflective material layer 15 including the concave meniscus shape by solidifying the uncured reflective material 15' under a predetermined curing condition, as shown in FIG. 6d.

Process (e) is preparing the uncured light-absorbing material mixed with a light-absorbing material with a binder, disposing the uncured reflective material 15' in the concave meniscus shape of the reflective layer 15, and forming the light-absorbing layer 26 on the top surface of the reflective material layer 15 so that the end of the light-absorbing layer 26 contacts with the highest position on the side surface of the wavelength converting layer 14, by solidifying the uncured light-absorbing material under a predetermined curing condition, and finishing the semiconductor light-emitting device in accordance with the second embodiment of the disclosed subject matter. The above process steps can be done consecutively and sequentially, or can be interchanged in timing and non-sequential.

According to the second embodiment of the disclosed subject matter, the side slant surface 130 of the transparent material layer 13 can be formed in a prescribed shape by disposing the uncured reflective material 15' between the frame 16 and both side surfaces of the wavelength converting layer 14 and the transparent material layer 13 and by creating the side slant surface 130 of the transparent material layer 13 using the surface tension of the uncured transparent material 13', and the reflective material layer 15 can be attached to the side surface of the wavelength converting layer 14.

Thereby, the reflector shape having a predetermined shape can be formed from the side surface of the semiconductor light-emitting chip 11 to the bottom surface of the wavelength converting layer 14 without a machining process. In addition, the manufacturing method can also dispose the reflective material layer 15 in the space between the bottom surface of the semiconductor light-emitting chip 11 and the mounting surface of the base board 10 when disposing the reflective material layer 15 between the frame 16 and both side surfaces of the wavelength converting layer 14 and the transparent material layer 13.

Accordingly, the manufacturing method can prevent the semiconductor light-emitting chip 11 from absorbing light returned on the side surface of the light-emitting chip 11 and can also prevent a decay of light emitted in the downward direction of the light-emitting chip 11. Thus, the manufacturing method can provide semiconductor light-emitting devices having a high light-emitting efficiency. Moreover, because the light-emitting surface of the device is small, light emitted from the semiconductor light-emitting device can be efficiently controlled by a small and simple optical member. Furthermore, the manufacturing method can vary the shape of the side slant surface 130 of the reflective material layer 15 by adjusting the amount of the uncured transparent material 13', which is applied on the top surface of the semiconductor light-emitting chip 11.

In the above-described manufacturing method, the uncured transparent material 13' is applied on the top surface of the semiconductor light-emitting chip 11 in process (b). However, the embodiment of the disclosed subject matter cannot be limited to this method. For example, the uncured transparent material 13' can be applied underneath the bottom surface of the wavelength converting layer 14, and also the uncured transparent material 13' can be applied both on the top surface of the semiconductor light-emitting chip 11 and underneath the bottom surface of the wavelength converting layer 14.

In addition, the uncured transparent material 13' can be disposed between the top surface of the semiconductor light-emitting surface 11 and the bottom surface of the wavelength converting layer 14 and around the side surface of the semiconductor light-emitting chip 11 while the semiconductor light-emitting chip 11 mounted on the base board 10 is directed downward. In this case, the uncured transparent material 13' can be disposed between the top surface of the semiconductor light-emitting chip 11 and the bottom surface of the wavelength converting layer 14 and around the side surface of the semiconductor light-emitting chip 11 by applying the uncured transparent material 13' underneath the top surface of the semiconductor light-emitting chip 11.

Moreover, the uncured transparent material 13' can be disposed between the top surface of the semiconductor light-emitting chip 11 and the bottom surface of the wavelength converting layer 14 and around the side surface of the semiconductor light-emitting chip 11 by applying the uncured transparent material 13' on the bottom surface of the wavelength converting layer 14. The uncured transparent material 13' can also be disposed between the top surface of the semiconductor light-emitting chip 11 and the bottom surface of the wavelength converting layer 14 and around the side surface of the semiconductor light-emitting chip 11 by applying the uncured transparent material 13' both underneath the top surface of the semiconductor light-emitting chip 11 and on the bottom surface of the wavelength converting layer 14.

A curvature for the side slant surface 130 of the reflective material layer 15 will now be described. The side slant surface 130 can be formed in a convex shape extending in an inward direction towards a center of the semiconductor light-emitting device in order to reflect the crosswise light emitted from the semiconductor light-emitting chip 11 toward the wavelength converting layer 14. In this case, for purpose of a search for a range of the curvature of the side slant surface 130, the number of rays that arrives at the wavelength converting layer 14 out of a total number of rays emitted from the semiconductor light-emitting chip 11 is calculated by a computer simulation while the curvature of the side slant surface 130 is varied.

The semiconductor light-emitting chip 11 used for the computer simulation included a sapphire substrate having a refractive index of 1.8 and a thickness of 90 micro meters used as the chip substrate located in a upward direction of the light-emitting chip 11, and a gallium nitride (GaN) chip having a refractive index of 2.54 and a thickness of 10 micro meters was used as a semiconductor layer located underneath the sapphire chip substrate, and a thickness of the semiconductor light-emitting chip 11 was 0.1 mil meters. An absorbing factor of the semiconductor light-emitting chip 11 was considered by replacing with a reflectance of 0.71.

The transparent material layer 13 included a transparent material having a refractive index of 1.54 and a thickness of 0.01 mil meters between the top surface of the semiconductor light-emitting chip 11 and the bottom surface of the wavelength converting layer 14, for the computer simulation. A refractive index of the side slant surface 130 of the reflective material layer 15 was defined as 0.98.

When the number of rays incident on the wavelength converting layer 14 was calculated by the computer simulation under the above described conditions, the number of rays incident on the wavelength converting layer 14 can obviously increase when the curvature of the side slant surface 130 is less than 5. Thus, the side slant surface 130 of the reflective material layer 15 can be formed in a convex shape having a curvature of 5 or less in the inward direction of the light-emitting device.

The reason why the number of rays incident on the wavelength converting layer 14 does not substantially increase when the curvature of the side slant surface 130 is larger than 5 may be that the number of rays incident on the wavelength converting layer 14 does not substantially increase because a part of the side slant surface 130 located close to the side surface of the semiconductor light-emitting chip 11 may become nearly parallel to the side surface of the semiconductor light-emitting chip 11, and therefore light reflected on the part of the side slant surface 130 may not get to the wavelength converting layer 14.

Figure 7:
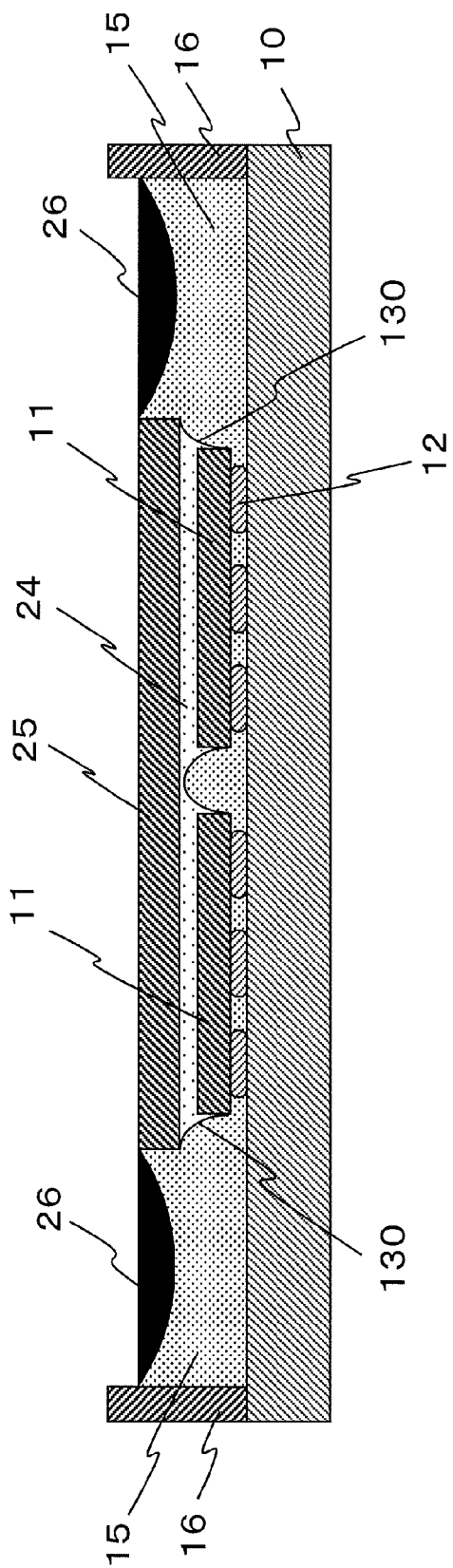
FIG. 7 is a front cross-section view showing a third exemplary embodiment of a semiconductor light-emitting device made in accordance with principles of the disclosed subject matter.

Third exemplary embodiments of the disclosed subject matter will now be described with reference to FIG. 7. FIG. 7 is a front cross-section view showing third exemplary embodiments of a semiconductor light-emitting device made in accordance with principles of the disclosed subject matter. Differences between the second embodiments and the third embodiments relates to the transparent material layer 13 and the wavelength converting layer 14 of the second embodiments.

The third embodiments of the semiconductor light-emitting device can include the wavelength converting layer 24 described in the first embodiments, on the top surface of the semiconductor light-emitting chip 11 in place of the transparent material layer 13 in the second embodiments as shown in FIG. 7. Accordingly, the side slant surface 130 that can perform an operation as the reflector shape for the light-emitting chip 11 can be located between the reflective material layer 15 and the wavelength converting layer 24 in the third embodiments, as well as between the reflective material layer 15 and the transparent material layer 13 in the second embodiments.

In addition, the semiconductor light-emitting device can include the transparent plate 25 described in the first embodiments, on the top surface of the wavelength converting layer 24 in place of the wavelength converting layer 14 in the second embodiments as shown in FIG. 7. Accordingly, the top surface of the transparent plate 25 that can operate as the light-emitting surface of the device can be located on the wavelength converting layer 24, and the side surface of the transparent plate 25 can be located adjacent the end of the top surface of the light-absorbing layer 26 in the third embodiments, in place of the top surface of the side surface of the wavelength converting layer 14. Other structures of the third embodiments can be the same as the second embodiments.

According to the semiconductor light-emitting device having the above-described structure, light emitted in an upward direction from the semiconductor light-emitting chip 11 can enter into the wavelength converting layer 24, and a wavelength converted light can be emitted from the top surface of the transparent plate 25 that is the light-emitting surface of the device via the transparent material layer 13, in common with the first embodiments. Light emitted in a downward direction from the semiconductor light-emitting chip 11 can be reflected at the bottom surface of the light-emitting chip 11 by the reflective material layer 15, and a wavelength converted light can be emitted from the top surface of the wavelength converting layer 14, in common with the second embodiments.

Light emitted in a crosswise direction from the semiconductor light-emitting chip 11 such as light emitted from the side surface of the light-emitting chip 11 can be reflected toward the transparent plate 25 via the wavelength converting layer 14, by the side slant surface 130 that is formed at the boundary between the reflective material layer 15 and the wavelength converting layer 14. Thus, the third embodiments of the disclosed subject matter can provide a small semiconductor light-emitting device having a small light-emitting surface, which is the top surface of the transparent plate 25. The semiconductor light-emitting device can form a light distribution pattern having a high light-emitting efficiency and a high contrast between the light-emitting surface and the non-light-emitting surface using the transparent plate 25 and the light-absorbing layer 26.

A manufacturing method for the third embodiments of the semiconductor light-emitting device can manufacture the semiconductor light-emitting device in common with the second embodiments, by applying an uncured wavelength converting material in place of the uncured transparent material 13' in process (b) shown in FIG. 6 and by mounting the transparent plate 25 in place of the wavelength converting layer 14 in process (c) shown in FIG. 6.

Figure 8:
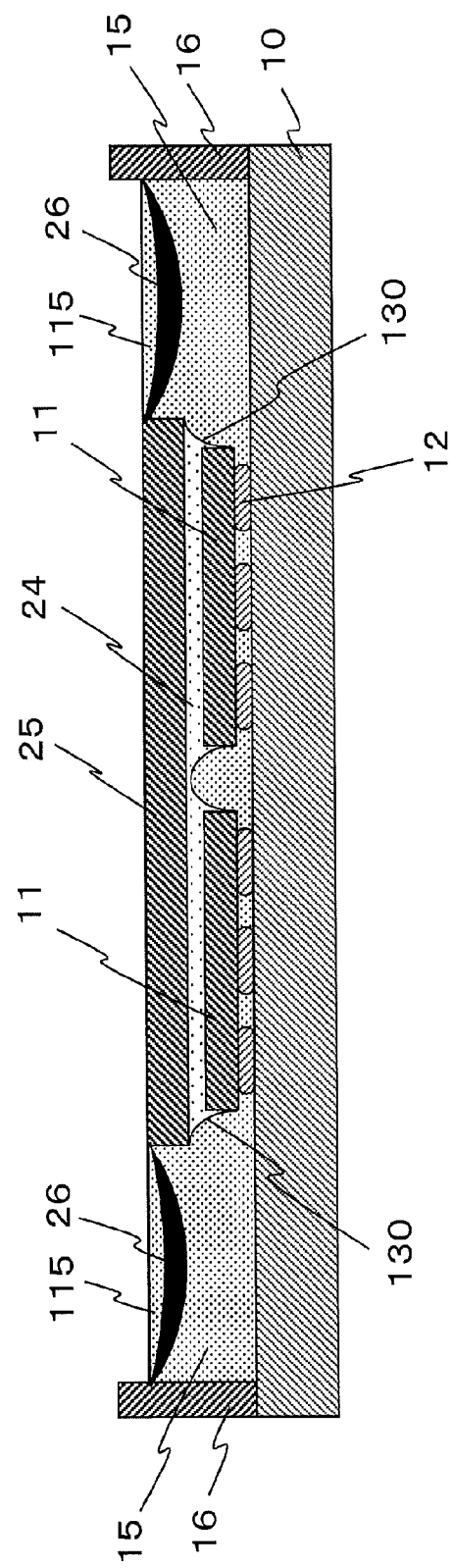
FIG. 8 is a front cross-section view showing a fourth exemplary embodiment of a semiconductor light-emitting device made in accordance with principles of the disclosed subject matter.

Fourth exemplary embodiments of the disclosed subject matter will now be described with reference to FIG. 8. FIG. 8 is a front cross-section view showing fourth exemplary embodiments of a semiconductor light-emitting device made in accordance with principles of the disclosed subject matter, wherein the fourth embodiment shows a variation of the third embodiment of the semiconductor light-emitting device. The forth embodiment can be applied to the first, second and third embodiment.

In the first, second and third embodiment, because the top surface of the light-absorbing layer 26 is exposed to the outside of the device, for example when light emitted from the light-emitting device is reflected by a member located outside of the device and enters into the top surface of the light-absorbing layer 26, a temperature of the light-absorbing layer 26 may increase by absorbing the light in the light-absorbing layer 26. Accordingly, a rise in temperature of the light-absorbing layer 26 may cause adverse effect in order for the light-absorbing layer 26 to provide an efficient operation for long periods of time.

Therefore, the semiconductor light-emitting device can include an other reflective material layer 115, which is disposed on the top surface of the light-absorbing layer 26 disposed in the concave shape of the reflective material layer 15. Thereby, the light-emitting device can prevent the light-absorbing layer 26 from the rise in temperature because the light reflected from the outside of the device can be reflected by the other reflective material layer 115 and is prevented from being absorbed by the light-absorbing layer 26.

In this case, the other reflective material layer 115 can be located on the light-absorbing layer 26 so that a top surface of the other reflective material layer 115 may not become higher than the light-emitting surface in the above-described embodiments. The other reflective material layer can be formed of the same material as the reflective material layer 15, and also can be formed of a different material from the reflective layer 15 if the other reflective material layer is made of a reflective material.

Figure 9:
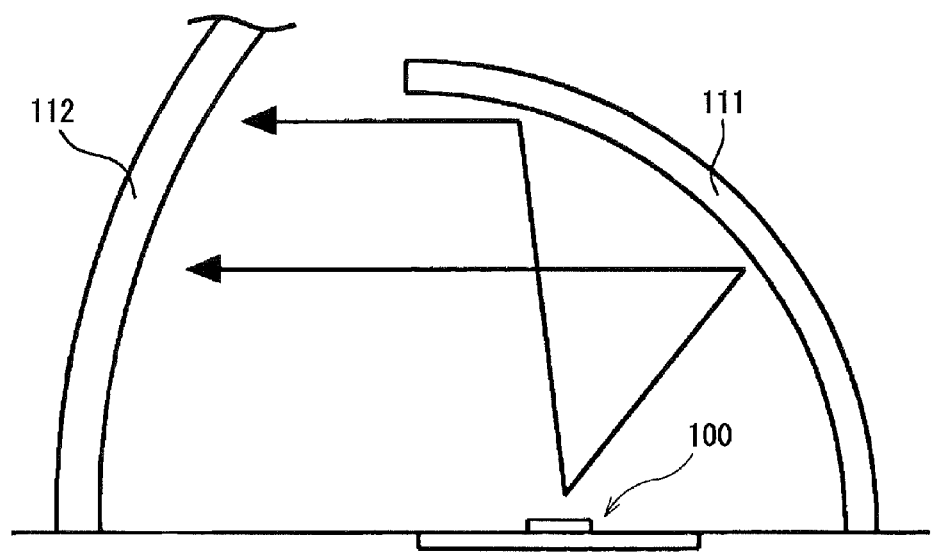
FIG. 9 is a schematic structural cross-section view depicting an exemplary embodiment of a vehicle headlight using a semiconductor light-emitting device made in accordance with principles of the disclosed subject matter.

An exemplary embodiment of a vehicle headlight using the above-described semiconductor light-emitting device will now be described with reference to FIG. 9. FIG. 9 is a schematic structural cross-section view depicting the exemplary embodiment of a vehicle headlight using the semiconductor light-emitting device made in accordance with principles of the disclosed subject matter.

The vehicle headlight can include: at least one parabolic reflector 111 having a focus and an opening; the semiconductor light-emitting device 100 located at the substantially focus of the parabolic reflector 111; and an outer lens 112 located in front of the opening of the parabolic reflector 111. In this case, one light-emitting device of the first, second, third and fourth embodiments can be used as the semiconductor light-emitting device 100. In addition, a projector headlight can also be configured with a simple structure by locating the semiconductor light-emitting device 100 at a focus on the optical axis of a projector lens so that the light-emitting surface of the device 100 faces an incident surface of the projector lens.

FIG. 10 is a schematic diagram showing a light distribution pattern including a horizontal cut-off line formed by the projector headlight, wherein the projector headlight shows only the semiconductor light-emitting device 100 in order to ease an understanding of the projector headlight. A light distribution pattern 103 including a horizontal cut-off line 101 can be formed on a virtual vertical screen 102 by the projector headlight using the semiconductor light-emitting device 100. The horizontal cut-off line 101 can be formed by the light-emitting line having a high contrast between the light-emitting surface and the non-light-emitting surface.

In this case, the light-emitting line having a high contrast can be formed in various shapes as described above. Therefore, the semiconductor light-emitting device of the disclosed subject matter can be used as a light source for a vehicle headlight including a low beam by enlarging a light distribution pattern emitted from the light-emitting surface of the device and by using the light-emitting line having a high contrast.

As described above, the disclosed subject matter can form a light-emitting surface in a small shape such that is slightly larger than the top surface of the semiconductor light-emitting chip 11, and can improve a light-emitting efficiency by using the side slant surface 130 of the reflective material layer 15 as a reflector for the light-emitting chip 11. In addition, the semiconductor light-emitting device can form a light distribution pattern including a light-emitting line having a high contrast by using the light-absorbing layer 26 of the non-light-emitting surface, which is located adjacent the light-emitting surface of the device. Thus, the disclosed subject matter can provide a semiconductor light-emitting device having a small light-emitting surface and a high light-emitting efficiency, which can be used for lighting units such as a vehicle headlight that controls light emitted from the light-emitting device using a reflector and/or a projector lens.

Moreover, for example, the side slant surface 130 can be formed by disposing the uncured transparent material 13' on the top surface of the light-emitting chip 11 and by disposing the uncured reflective material between the frame 16 and at least the transparent material layer 13 without a mechanical process. Thus, the method of the disclosed subject matter can provide a semiconductor light-emitting device capable of being used as a lighting unit such as a headlight using manufacturing machines that are similar to those used to manufacture conventional semiconductor light-emitting devices.

Furthermore, the above-described embodiments are mainly described as a light source device for a vehicle headlight. However, the semiconductor light-emitting device can incorporate various colored lights by combining the above-described semiconductor chip 11 with the wavelength converting layer 14 including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, the multiple chip embodiment could include slant surfaces 130 that are concave. In addition, one side of a device can include a slant surface 130 that is convex while another side of the device includes a slant surface 130 that is concave. In addition, it is contemplated that any different color chip or different wavelength material can be used in any of the disclosed embodiments and in any combination. Moreover, each of the specifically referenced features of each of the disclosed embodiments can be interchanged with each other in the various embodiments in all possible combinations of the referenced features.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
a base board having a mounting surface and a conductor pattern located adjacent the mounting surface;
at least one semiconductor light-emitting chip having a top surface, a side surface and a bottom surface, and including chip electrodes adjacent the bottom surface, each of the chip electrodes electrically connected to a respective portion of the conductor pattern of the base board via solder bumps;
a wavelength converting layer having a top surface and a side surface, the wavelength converting layer including at least one phosphor, and encapsulating the at least one semiconductor light-emitting chip so as to surround the solder bumps along with the mounting surface of the base board;
a transparent plate having a top surface, a side surface, a bottom surface and an edge portion located between the top surface and the side surface, and disposed adjacent the top surface of the wavelength converting layer, wherein the side surface of the transparent plate is substantially aligned with the side surface of the wavelength converting layer;
a frame located adjacent the mounting surface of the base board so as to surround the wavelength converting layer and the transparent plate;
a reflective material layer having a top surface and an end of the top surface, disposed between the frame and both the side surface of the wavelength converting layer and the side surface of the transparent plate so that the end of the top surface of the reflective material layer contacts with the side surface of the transparent plate, and the top surface of the reflective material layer including one of a concave meniscus shape and a convex meniscus shape;
a light-absorbing layer having a top surface and an end of the top surface, and disposed on the one of the concave meniscus shape and the convex meniscus shape of the reflective material layer, wherein the end of the top surface of the light-absorbing layer contacts with the side surface of the transparent plate at a position that is higher relative to the base board than the end of the top surface of the reflective material layer.

2. The semiconductor light-emitting device according to claim 1, further comprising:
a transparent material layer having a side surface located between the bottom surface of the transparent plate and the top surface of the wavelength converting layer, wherein the side surface of the transparent material layer is substantially aligned with both the side surface of the wavelength converting layer and the side surface of the transparent plate.

3. A semiconductor light-emitting device, comprising:
a base board having a mounting surface and a conductor pattern located adjacent the mounting surface;
at least one semiconductor light-emitting chip having a top surface, a side surface and a bottom surface, and including chip electrodes adjacent the bottom surface, each of the chip electrodes electrically connected to a respective portion of the conductor pattern of the base board via solder bumps;
a wavelength converting layer having a top surface, a side surface, a bottom surface and an edge portion located between the top surface and the side surface, the wavelength converting layer including at least one phosphor, and located over the top surface of the at least one semiconductor light-emitting chip so that the bottom surface of the wavelength converting layer covers the top surface of the at least one semiconductor light-emitting chip;
a transparent material layer having a side surface disposed between the bottom surface of the wavelength converting layer and the side surface of the at least one semiconductor light-emitting chip so that the side surface of the transparent material layer extends from the side surface of the at least one semiconductor light-emitting chip toward the bottom surface of the wavelength converting layer;
a frame located adjacent the mounting surface of the base board so as to surround the at least one semiconductor light-emitting chip, the transparent material layer and the wavelength converting layer;
a reflective material layer having a top surface, a side slant surface and an end of the top surface, disposed at least between the frame and both the side surface of the wavelength converting layer and the side surface of the transparent material layer and between the bottom surface of the at least one semiconductor light-emitting chip and the mounting surface of the base board while surrounding the solder bumps, the side slant surface of the reflective material layer contacting with the side surface of the transparent material layer and extending from the side surface of the at least one semiconductor light-emitting chip toward the bottom surface of the wavelength converting layer, the end of the top surface of the reflective material layer contacting with the side surface of the wavelength converting layer, and the top surface of the reflective material layer including one of a concave meniscus shape and a convex meniscus shape; and
a light-absorbing layer having a top surface and an end of the top surface, and disposed on the one of the concave meniscus shape and the convex meniscus shape of the reflective material layer, wherein the end of the top surface of the light-absorbing layer contacts with the side surface of the transparent plate at a position that is higher relative to the base board than the end of the top surface of the reflective material layer.

4. A semiconductor light-emitting device, comprising:
a base board having a mounting surface and a conductor pattern located adjacent the mounting surface;
at least one semiconductor light-emitting chip having a top surface, a side surface and a bottom surface, and including chip electrodes adjacent the bottom surface, each of the chip electrodes electrically connected to a respective portion of the conductor pattern of the base board via solder bumps;
a transparent plate having a top surface, a side surface, a bottom surface and an edge portion located between the top surface and the side surface, and located over the top surface of the at least one semiconductor light-emitting chip so that the bottom surface of the transparent plate covers the top surface of the at least one semiconductor light-emitting chip;
a wavelength converting layer having a side surface and including at least one phosphor, the wavelength converting layer disposed between the bottom surface of the transparent plate and the side surface of the at least one semiconductor light-emitting chip so that the side surface of the wavelength converting layer extends from the side surface of the at least one semiconductor light-emitting chip toward the bottom surface of the transparent plate;
a frame located adjacent the mounting surface of the base board so as to surround the at least one semiconductor light-emitting chip, the wavelength converting layer and the transparent plate;
a reflective material layer having a top surface, a side slant surface and an end of the top surface, disposed at least between the frame and both the side surface of the transparent plate and the side surface of the wavelength converting layer and between the bottom surface of the at least one semiconductor light-emitting chip and the mounting surface of the base board while surrounding the solder bumps, the side slant surface of the reflective material layer contacting with the side surface of the wavelength converting layer and extending from the side surface of the at least one semiconductor light-emitting chip toward the bottom surface of the transparent plate, the end of the top surface of the reflective material layer contacting with the side surface of the transparent plate, and the top surface of the reflective material layer including one of a concave meniscus shape and a convex meniscus shape; and a light-absorbing layer having a top surface and an end of the top surface, and disposed on the one of the concave meniscus shape and the convex meniscus shape of the reflective material layer, wherein the end of the top surface of the light-absorbing layer contacts with the side surface of the transparent plate at a position that is higher relative to the base board than the end of the top surface of the reflective material layer.

5. The semiconductor light-emitting device according to claim 1, further comprising:

an other reflective material layer having a top surface and an end of the top surface, disposed on the top surface of the light-absorbing layer, and covering the top surface of the light-absorbing layer with the other reflective material layer, and the end of the top surface of the other reflective material layer contacting with one of a lower position on the side surface of the transparent plate than the edge portion of the transparent plate and a substantially same position as the edge portion of the transparent plate.

6. The semiconductor light-emitting device according to claim 3, further comprising:

an other reflective material layer having a top surface and an end of the top surface, disposed on the top surface of the light-absorbing layer, and covering the top surface of the light-absorbing layer with the other reflective material layer, and the end of the top surface of the other reflective material layer contacting with one of a lower position on the side surface of the wavelength converting layer than the edge portion of the wavelength converting layer and a substantially same position as the edge portion of the wavelength converting layer.

7. The semiconductor light-emitting device according to claim 4, further comprising:

an other reflective material layer having a top surface and an end of the top surface, disposed on the top surface of the light-absorbing layer, and covering the top surface of the light-absorbing layer with the other reflective material layer, and the end of the top surface of the other reflective material layer contacting with one of a lower position on the side surface of the transparent plate than the edge portion of the transparent plate and a substantially same position as the edge portion of the transparent plate.

8. The semiconductor light-emitting device according to claim 1, wherein at least a part of the end of the top surface of the light-absorbing layer is located substantially at the edge portion of the transparent plate.

9. The semiconductor light-emitting device according to claim 3, wherein at least a part of the end of the top surface of the light-absorbing layer is located substantially at the edge portion of the wavelength converting layer.

10. The semiconductor light-emitting device according to claim 4, wherein at least a part of the end of the top surface of the light-absorbing layer is located substantially at the edge portion of the transparent plate.

11. The semiconductor light-emitting device according to claim 1, wherein the reflective material layer includes particles of titanium oxide and a density of the particles of titanium oxide included in the reflective material layer is between 8 weight percent and 30 weight percent.

12. The semiconductor light-emitting device according to claim 1, wherein the light-absorbing layer includes a carbon material and a light-absorbing ratio of the light-absorbing layer is 60 percent or more.

13. The semiconductor light-emitting device according to claim 1, wherein the at least one light-emitting chip includes a blue light-emitting chip and the at least one phosphor of the wavelength converting layer is selected from the group consisting of a yellow phosphor, and two phosphors including a red phosphor layer and a green phosphor layer.

14. The semiconductor light-emitting device according to claim 3, wherein the side slant surface of the reflective material layer is formed in at least one of a substantially linear shape and a convex shape having a curvature of 5 or less extending in a direction toward the at least one semiconductor light-emitting chip between the side surface of the at least one semiconductor light-emitting chip and the bottom surface of the wavelength converting layer.

15. The semiconductor light-emitting device according to claim 4, wherein the side slant surface of the reflective material layer is formed in at least one of a substantially linear shape and a convex shape having a curvature of 5 or less extending in a direction toward the at least one semiconductor light-emitting chip between the side surface of the at least one semiconductor light-emitting chip and the bottom surface of the transparent plate.

16. A vehicle headlight including the semiconductor light-emitting device according to claim 1, further comprising:

at least one parabolic reflector having a focus and an opening, the focus of the at least one parabolic reflector located substantially at the top surface of the transparent plate of the semiconductor light-emitting device; and an outer lens located in front of the opening of the at least one parabolic reflector.

17. A vehicle headlight including the semiconductor light-emitting device according to claim 1, further comprising:

a projector lens having an incident surface, an optical axis and a focus located on the optical axis toward the incident surface, the focus of the projector lens located substantially at the top surface of the transparent plate, and the incident surface of the projector lens facing the top surface of the transparent plate.

18. A method for manufacturing the semiconductor light-emitting device according to claim 2, comprising:

providing the base board;

connecting each of the chip electrodes of the at least one semiconductor light-emitting chip to a respective portion of the conductor pattern of the base board via the solder bumps;

encapsulating the at least one semiconductor light-emitting chip with an uncured wavelength converting material;

disposing an uncured transparent material on the wavelength converting layer;

mounting the transparent plate on the transparent material layer;

disposing an uncured reflective material between the frame and the side surfaces of the wavelength converting layer, the transparent material layer and the transparent plate; and disposing an uncured light-absorbing material on the one of the concave meniscus shape and the convex meniscus shape of the reflective material layer.

19. A method for manufacturing the semiconductor light-emitting device according to claim 3, comprising:
provides the base board;
connecting each of the chip electrodes of the at least one semiconductor light-emitting chip to a respective portion of the conductor pattern of the base board via the solder bumps;
disposing an uncured transparent material on the top surface of the at least one semiconductor light-emitting chip;
mounting the wavelength converting layer on the uncured transparent material;
disposing an uncured reflective material at least between the frame and both the side surface of the wavelength converting layer and the side surface of the transparent material layer and between the bottom surface of the at least one semiconductor light-emitting chip and the mounting surface of the base board; and
disposing an uncured light-absorbing material on the one of the concave meniscus shape and the convex meniscus shape of the reflective material layer.

20. A method for manufacturing the semiconductor light-emitting device according to claim 4, comprising:
providing the base board;
connecting each of the chip electrodes of the at least one semiconductor light-emitting chip to a respective portion of the conductor pattern of the base board via the solder bumps;
disposing an uncured wavelength converting material on the top surface of the at least one semiconductor light-emitting chip;
mounting the transparent plate on the uncured wavelength converting material;
disposing an uncured reflective material at least between the frame and both the side surface of the wavelength converting layer and the side surface of the transparent plate and between the bottom surface of the at least one semiconductor light-emitting chip and the mounting surface of the base board; and
disposing an uncured light-absorbing material on the one of the concave meniscus shape and the convex meniscus shape of the reflective material layer.

* * * * *